(12) United States Patent
Morelli et al.

(10) Patent No.: US 10,622,534 B2
(45) Date of Patent: Apr. 14, 2020

(54) THERMOELECTRIC MATERIALS BASED ON TETRAHEDRITE STRUCTURE FOR THERMOELECTRIC DEVICES

(71) Applicant: BOARD OF TRUSTEES OF MICHIGAN STATE UNIVERSITY, East Lansing, MI (US)

(72) Inventors: Donald T. Morelli, White Lake, MI (US); Xu Lu, East Lansing, MI (US)

(73) Assignee: Board of Trustees of Michigan State University, East Lansing, MI (US)

(*) Notice: Subject to any disclaimer, the term of this patent is extended or adjusted under 35 U.S.C. 154(b) by 244 days.

(21) Appl. No.: 14/901,206

(22) PCT Filed: Jul. 3, 2014

(86) PCT No.: PCT/US2014/045458
§ 371 (c)(1),
(2) Date: Dec. 28, 2015

(87) PCT Pub. No.: WO2015/003157
PCT Pub. Date: Jan. 8, 2015

(65) Prior Publication Data
US 2016/0141481 A1    May 19, 2016

Related U.S. Application Data

(60) Provisional application No. 61/842,842, filed on Jul. 3, 2013.

(51) Int. Cl.
*H01L 35/18*    (2006.01)
*C01G 30/00*    (2006.01)
(Continued)

(52) U.S. Cl.
CPC ............ *H01L 35/18* (2013.01); *C01G 30/002* (2013.01); *C01G 49/009* (2013.01); *H01L 35/34* (2013.01);
(Continued)

(58) Field of Classification Search
CPC .................................................. H01L 35/02–34
(Continued)

(56) References Cited

U.S. PATENT DOCUMENTS 3,256,702 A    6/1966  Henderson
4,242,124 A   12/1980  Makipirtti
(Continued)

FOREIGN PATENT DOCUMENTS

CN    101573309 A    11/2009
CN    101993247 A     3/2011
(Continued)

OTHER PUBLICATIONS

Lu et al., (Rapid synthesis of high performance thermoelectric materials directly from natural mineral tetrahedrite).*
(Continued)

*Primary Examiner* — Niki Bakhtiari
(74) *Attorney, Agent, or Firm* — Harness, Dickey & Pierce, PLC

(57) ABSTRACT

Thermoelectric materials based on tetrahedrite structures for thermoelectric devices and methods for producing thermoelectric materials and devices are disclosed. The thermoelectric device has a pair of conductors and a p-type thermoelectric material disposed between the conductors. The thermoelectric material is at least partially formed of a hot pressed high energy milled tetrahedrite formed of tetrahedrite ore and pure elements to form a tetrahedrite powder of $Cu_{12-x}M_xSb_4S_{13}$ disposed between the conductors, where M is at least one of Zn and Fe.

9 Claims, 25 Drawing Sheets

(51) Int. Cl.
H01L 35/34 (2006.01)
C01G 49/00 (2006.01)
(52) U.S. Cl.
CPC ...... C01P 2002/72 (2013.01); C01P 2004/03 (2013.01); C01P 2006/40 (2013.01)
(58) Field of Classification Search
USPC .................................................. 136/200–242
See application file for complete search history.

(56) References Cited

U.S. PATENT DOCUMENTS

| | | | | |
|---|---|---|---|---|
| 2003/0056819 | A1* | 3/2003 | Imai | C01B 17/20 136/239 |
| 2011/0108778 | A1* | 5/2011 | Ren | B82Y 30/00 252/521.1 |
| 2012/0111385 | A1 | 5/2012 | Ramanath et al. | |
| 2015/0011042 | A1 | 1/2015 | Kimball et al. | |
| 2015/0200345 | A1 | 7/2015 | Morelli et al. | |
| 2017/0331023 | A1 | 11/2017 | Morelli et al. | |
| 2018/0233646 | A1 | 8/2018 | Morelli et al. | |

FOREIGN PATENT DOCUMENTS

| | | |
|---|---|---|
| JP | S54096402 A | 7/1979 |
| JP | 2004179264 A | 6/2004 |
| JP | 2006019355 A | 1/2006 |
| JP | 2006269731 A | 10/2006 |
| JP | 2007116156 A | 5/2007 |
| JP | 2011-061031 A | 3/2011 |
| WO | WO-2014168963 A1 | 10/2014 |

OTHER PUBLICATIONS

Office Action regarding Japanese Patent Application No. 2015-520687, dated Apr. 4, 2017. Translation provided by Harakenzo World Patent and Trademark.
European Patent Application No. 13740424.0 Communication Purusant to Article 94(3) EPC, dated Jan. 30, 2017.
Japanese Application No. 2015-520687 Office Action dated Dec. 20, 2016. Translation provided by Harakenzo World Patent and Trademark.
European Application No. 14820390.4 Communication Pursuant to Rules 70(2) and 70a(2) EPC, dated Nov. 17, 2016.
Chinese Application No. 2013800360335; Office Action dated Jan. 15, 2016 Translation provided by Dragon Intellectual Poroperty Law.
Chinese Application No. 2013800360335; Office Action dated Sep. 6, 2016 Translation provided by Dragon Intellectual Poroperty Law.
International Preliminary Report on Patentability for PCT/US2013/049350, dated Jan. 6, 2015.
International Search Report and Written Opinion for PCT/US2013/049350, dated Sep. 9, 2013, ISA/EP.
Supplementay European Search Report for Application No. EP14820390, dated Oct. 17, 2016.
Extended European Search Report for Application No. EP14820390, dated Oct. 31, 2016.
U.S. Appl. No. 14/413,196, filed Jan. 6, 2015, Donald T. Morelli et al.
U.S. Appl. No. 62/201,820, filed Aug. 6, 2015, Donald T. Morelli et al.

Lu et al. "High Performance Thermoelectricity in Earth-Abundant Compounds Based on Natural Mineral Tetrahedrites." Advanced Energy Materials, 3(3):342-348, Mar. 2013. [retrieved on Mar. 10, 2014]. Retrieved from the Internet <URL:http://onlinelibrary.wiley.com/doi/10.1002/aenm.201200650/abstract>.
International Search Report and Written Opinion of the International Searching Authority for PCT/US2014/045458, dated Nov. 3, 2014; ISA/US.
Suekuni, Koichiro, et al.: "Thermoelectric Properties of Mineral Tetrahedrites Cu10Tr2Sb4S13 with Low Thermal Conductivity", Applied Physics Express, The Japan Society of Applied Physics, vol. 5, No. 5, May 1, 2012 (May 1, 2012), pp. 51201-1, XP001576490, ISSN: 1882-0778, DOI: 10.1143/APEX.5.051201 [retrieved on May 10, 2012].
Lu, Xu, et al.: "High Performance Thermoelectricity in Earth-Abundant Compounds Based on Natural Mineral Tetrahedrites", Advanced Energy Materials, vol. 3, Oct. 18, 2012 (Oct. 18, 2012), pp. 342-348, XP002712392.
Lu, Xu, et al.: "Natural mineral tetrahedrite as a direct source of thermoelectric materials", Physical Chemistry Chemical Physics, vol. 15, No. 16, Mar. 14, 2013 (Mar. 14, 2013), p. 5762, XP0055077893, ISSN: 1463-9076, DOI: 10.1039/c3cp50920f.
Suekuni, Koichiro, et al.: "High-performance thermoelectric mineral CuNiSbStetrahedrite", Journal of Applied Physics, American Institute of Physics, New York, US, vol. 113, No. 4, Jan. 28, 2013 (Jan. 28, 2013), pp. 43712-43712, XP012169695, ISSN: 0021-8979, DOI: 10.1063/1.4789389 [retrieved on Jan. 28, 2013].
Kiyoaki Tatsuka et al.: Tetrahedrite stability relations in the Cu—Fe—Sb—S system; American Mineralogist, vol. 62, pp. 1101-1109, 1977.
English language translation of International Preliminary Report on Patentability (Chapter I) for PCT/US2014/045458; dated Jan. 5, 2016; 8 pp.
European Application No. 14820390.4 Communication Pursuant to Article 94(3) EPC dated Oct. 16, 2017.
Office Action regarding Japanese Patent Application No. 2016-524830, dated Dec. 19, 2017. Translation provided by Harakenzo World Patent and Trademark.
Office Action regarding European Patent Application No. 14820390.4, dated May 16, 2018.
International Search Report and Written Opinion of the International Searching Authority issued in PCT/US2015/066796, dated Oct. 13, 2016; ISA/US.
An, Changhua et al., "Selective synthesis and characterization of famatinite nanofibers and tetrahedrite nanoflakes." Journal of Materials Chemistry, vol. 13, No. 2, 2003, pp. 301-303.
Biswas, Kanishka et al., "High-performance bulk thermoelectrics with all-scale hierarchical architectures." Nature, vol. 489, 2012, pp. 414-418.
Telkes, Maria, "Thermoelectric power and electrical resistivity of minerals." American Mineralogist, vol. 35, No. 7-8, 1950, pp. 536-555.
Office Action regarding European Patent Application No. 13740424.0, dated Jan. 3, 2018.
International Preliminary Report on Patentability for International Application No. PCT/US2015/066796, dated Feb. 5, 2018.
Office Action regarding Japanese Patent Application No. 2016-524830, dated Oct. 23, 2018. Partial translation provided by Harakenzo World Patent and Trademark.
Office Action regarding European Patent Application No. 14820390.4, dated Dec. 4, 2018.
Office Action regarding European Patent Application No. 13740424.0, dated Dec. 13, 2018.

* cited by examiner

THERMOELECTRIC MATERIALS BASED ON TETRAHEDRITE STRUCTURE FOR THERMOELECTRIC DEVICES

CROSS-REFERENCE TO RELATED APPLICATIONS

This application is a 371 U.S. National Stage of International Application No. PCT/US2014/045458, filed Jul. 3, 2014, and published in English as WO 2015/003157 A1 on Jan. 8, 2015, which claims the benefit of U.S. Provisional Application No. 61/842,842, filed Jul. 3, 2013. The entire disclosures of the above applications are incorporated herein by reference.

GOVERNMENT RIGHTS

This invention was made with Government support under Grant No. DE-SC0001054 awarded by the United States Department of Energy. The U.S. Government has certain rights in this invention.

FIELD

The present disclosure relates to thermoelectric materials based on tetrahedrite structure for thermoelectric devices and, more particularly, to the manufacturing and uses for tetrahedrite like thermoelectric materials.

BACKGROUND AND SUMMARY

This section provides background information related to the present disclosure that is not necessarily prior art. Thermoelectric materials may be used for direct conversion of heat to electricity and, thus, can substantially increase the efficiency of energetic processes. Current state of the art thermoelectric materials are comprised of elements which are in low abundance and often toxic.

In the past few decades, thermoelectric (TE) materials have been a focus topic in solid-state physics and materials science due to their potential application in waste energy harvesting or Peltier cooling. The efficiency of thermoelectric materials is evaluated by the figure of merit ($ZT=S^2\sigma T/\kappa$), where S is the Seebeck coefficient, a the electric conductivity, T the absolute temperature, and κ thermal conductivity. For many years, the benchmark for a good thermoelectric material has been ZT of order unity, typified by $Bi_2Te_3$ and its alloys which are used commercially in thermoelectric cooling modules. Over the last 15 years, with a more complete understanding of electronic and thermal transport in semiconductors, better control over synthesis methods, and the successful application of nanotechnology, new materials systems with ZT values higher than unity have been discovered and developed, including thin film superlattices, filled skutterudites, and bulk nano-structured chalcogenides. Unfortunately, many of these new materials are not suitable for large scale application because of complex and costly synthesis procedures, or the use of rare or toxic elements.

A current challenge is the discovery of new thermoelectric materials which are inexpensive, environmental-friendly, easy to synthesize, and comprised of earth-abundant elements. The old concept of the Seebeck effect, which describes how heat can be converted into electricity in thermoelectric (TE) materials, has been an active area of research in solid state physics and materials science in the past two decades. The performance of a thermoelectric material is characterized by the dimensionless figure of merit zT=sfffT/K, where S is the Seebeck coefficient, a the electrical conductivity, T the absolute temperature, and κ thermal conductivity. For traditional thermoelectric materials, zT values are typically of order of unity. Higher performance thermoelectric materials can be realized by improving the power factor ($S^{2\wedge}$) or reducing thermal conductivity. By band structure engineering, tuning the carrier concentration, or introducing nanostructures, zT values can be raised to more than 1.5 or even higher at high temperature, as has been shown for some filled skutterudites and bulk nano-structured chalcogenides. Very recently, Biswas et al. reported that PbTe—SrTe doped with Na shows a maximum zT value of 2.2 at 923K due to a hierarchical structure that maximizes phonon scattering. Unfortunately, however, many of these new materials use rare or toxic elements, impeding their application on a large scale. Some work has been done to avoid these rare or toxic elements; for example, $Ca_3AlSb_3$ with zT value of 0.8 at 1050 K has been reported,[4] and PbS nanostructured with SrS and CaS shows a zT value of 1.2 at 923K.[5] Nevertheless, these systems still require complex and carefully controlled synthesis procedures.

One very successful route to improving ZT in bulk solids is reduction of lattice thermal conductivity. For instance, the notion of "phonon glass/electron crystal (PGEC)" was introduced to describe materials that exhibit lattice thermal conductivity like a glassy or amorphous solid, and electronic properties of a good crystal. For amorphous or glassy solids, the phonon mean free path approaches one interatomic spacing; a phonon mean free path shorter than one interatomic spacing loses its meaning, and thus this type of thermal transport has been termed "minimal" thermal conductivity. Unfortunately, poor electrical conductivity in such amorphous solids prevents them from exhibiting high values of figure of merit. More interesting from the thermoelectric point of view are crystalline solids which exhibit minimal thermal conductivity, due to strong intrinsic phonon scattering. Examples here include, in addition to the afore-mentioned skutterudites, complex cage structures such as clathrates. Recently, minimal thermal conductivity was discovered in crystalline rocksalt structure $I-V-VI_2$ compounds (e.g., $AgSbTe_2$), semiconductors typified by the lattice thermal conductivity of a glassy or amorphous system. These materials exhibit electronic properties characteristic of good crystals and thus have demonstrated good thermoelectric behavior.

Recently, a correlation between minimal thermal conductivity and the existence of an Sb lone pair in Sb-containing ternary semiconductors has been identified. Lone pair electrons induce large lattice anharmonicity that gives rise to thermal resistance. Using density functional theory calculations, it has been demonstrated explicitly the occurrence of large Grüneisen parameter in $Cu_3SbSe_3$ compounds and, using these parameters to calculate phonon scattering rates, were able to quantitatively account for the thermal conductivity using the Debye-Callaway formalism.

One further issue with the formation of these materials comes from the general chemistry of the problem. In addition to stoichiometric precision, crystal structure is also very important. In this regard, when more than three materials are mixed, heated, and then cooled, many of the materials will preferentially combine into crystal structures which do not possess the preferred crystal structure to maximize thermoelectric effects. In this regard, phases such as $Cu_3SbS_4$ that have high thermocoefficients can be formed, thus reducing the thermoelectric properties of these materials. While bulk heating of these materials can convert some of the crystal structures to desirable forms, the net result is far from assured.

According to the present teachings, a thermoelectric device is provided. The thermoelectric device has a pair of conductors and a p-type thermoelectric material disposed between the conductors. The thermoelectric material is at least partially formed of a hot pressed high energy milled tetrahedrite formed of tetrahedrite ore and pure elements to form a tetrahedrite powder of $Cu_{12-x}M_xSb_4S_{13}$ disposed between the conductors, where M is at least one of Zn and Fe.

According to the present teachings, a method of producing a thermoelectric device is provided. The method included high energy milling tetrahedrite having natural tetrahedrite ore and pure elements to form a tetrahedrite powder of $Cu_{12-x}M_xSb_4S_{13}$ wherein M is selected from the group of Zn at a concentration $0<x<2.0$, Fe at a concentration $0<x<1.5$, and combinations thereof. The high energy milled tetrahedrite is hot pressed to form a pellet to a density greater than 95%. The pellet is then disposed between a pair of electrical conductors.

According to the present teachings, a thermoelectric is performed. The material is formed of a high energy milled tetrahedrite comprising natural tetrahedrite ore and powder elements to form a tetrahedrite powder of $Cu_{12-x}M_xSb_{4-y}As_yS_{13}$, wherein M is selected from the group of Zn at a concentration $0<x<2.0$, Fe at a concentration $0<x<1.5$, and combinations thereof.

According to the present teachings, a thermoelectric device provides a pair of thermal conductor, and hot pressed high energy milled tetrahedrite comprising natural tetrahedrite and powder elements milled to form a tetrahedrite powder of $Cu_{12-x}M_xSb_4S_{13}$ disposed between the thermal conductors, where M is one of Zn and Fe.

According to the present teachings, a thermoelectric device provides a pair of conductors and a p-type thermoelectric material disposed between the conductors. The thermoelectric material is formed of hot pressed high energy milled tetrahedrite formed of tetrahedrite ore and pure elements to form a tetrahedrite powder of $Cu_{12-x}M_xSb_4S_{13}$ disposed between the conductors, where M is at least one of Zn and Fe.

According to the present teachings, a method of producing a thermoelectric device is provided. The method included high energy milling tetrahedrite comprising natural tetrahedrite ore and pure elements to form a tetrahedrite powder of $Cu_{12-x}M_xSb_4S_{13}$ wherein M is selected from the group of Zn at a concentration $0<x<2.0$, Fe at a concentration $0<x<1.5$, and combinations thereof. The tetrahedrite is hot pressed to form a pellet to a density greater than 95%. Lastly, the pellet is disposed between a pair of electrical conductors.

The chemical compositions described herein are synthesized from earth abundant materials and in some cases can be extracted in nearly ready-to-use form from the earth's crust. Furthermore, the compounds are comprised of elements of low atomic mass, such that the density of the compounds is significantly less than state of the art compounds. These compounds can be used in provide, lightweight, low-cost thermoelectric devices for large scale conversion of heat to electricity.

$Cu_{12}Sb_4S_{13}$, the base composition of a large family of natural minerals called tetrahedrites, is structurally very closely related to the $Cu_3SbSe_3$ phase; its unit cell can be considered as quadruplicate of the $Cu_3SbS_3$ unit cell. It possesses a cubic sphalerite-like structure with six of the twelve Cu atoms occupying trigonal planar sites with the remaining Cu atoms distributed on tetrahedral sites. In terms of a crystal-chemical formula, four of the six tetrahedral sites are thought to be occupied by monovalent Cu, while the other two are occupied by $Cu^{2+}$ ions; the trigonal planar sites are occupied solely by monovalent Cu. Magnetic measurements supporting the present invention reveal that antiferromagnetic interactions occur between the $Cu^{2+}$ ions and induce a magnetic ordering transition below 83 K. The Sb atoms also occupy a tetrahedral site but are bonded to only three sulfur atoms, leading to a void in the structure and a lone pair of electrons, just as $Cu_3SbSe_3$. A powder processing procedure is disclosed using natural mineral tetrahedrite ore, the most widespread sulfosalt on earth to provide a low cost, high throughput mechanism of producing thermoelectric materials with high conversion efficiency.

The current teachings are superior to the prior art because they describe compounds that 1) are made from earth-abundant elements and are themselves common and widespread minerals in the earth crust; 2) consist of elements of light atomic mass, leading to low density and ultimately lower weight devices; 3) require no special processing beyond melting, annealing, and powder processing; 4) exhibit large thermoelectric figure of merit can be maintained over a wide range of composition, simplifying the synthesis procedure; and 5) are of composition that span the range of compositions of the large mineral families of tetrahedrite and tennantite, indicating that these minerals may be used directly as source materials for high efficiency thermoelectrics, leading to considerable cost savings.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2b represents the Seebeck coefficient of tetrahedrite of composition $Cu_{12-x}Zn_xSb_4S_{13}$; sample designation as in FIG. 2a;

Figure 3A:
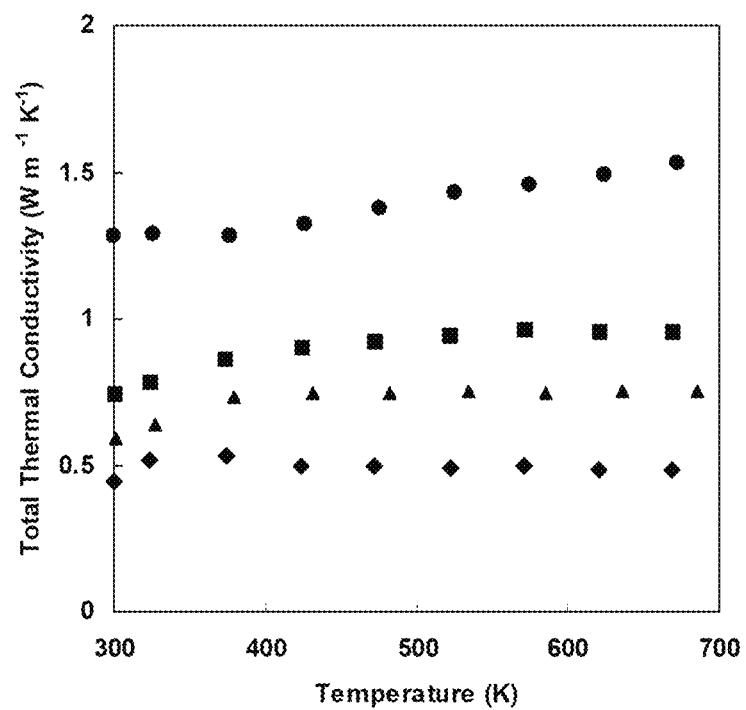
Figure 3B:
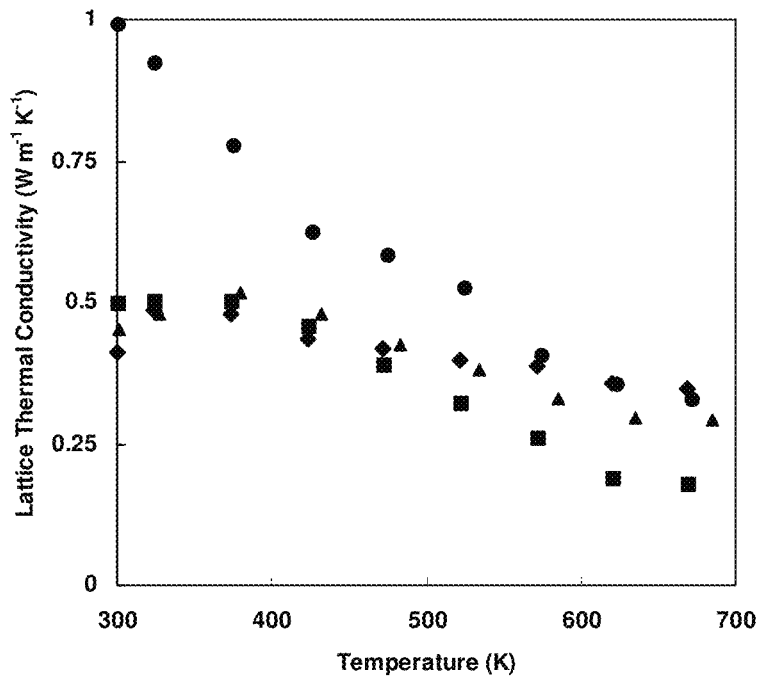
Figure 4A:
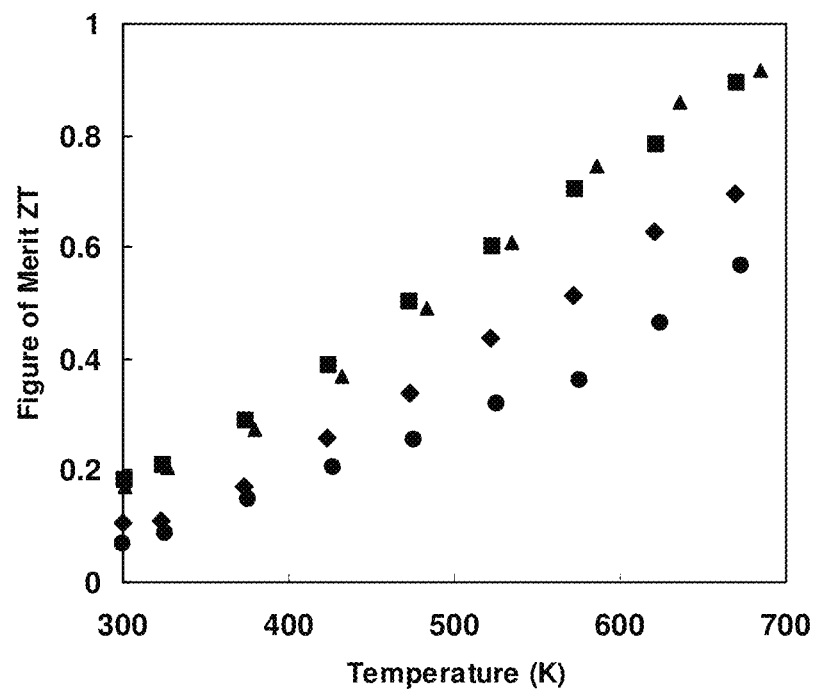
Figure 4B:
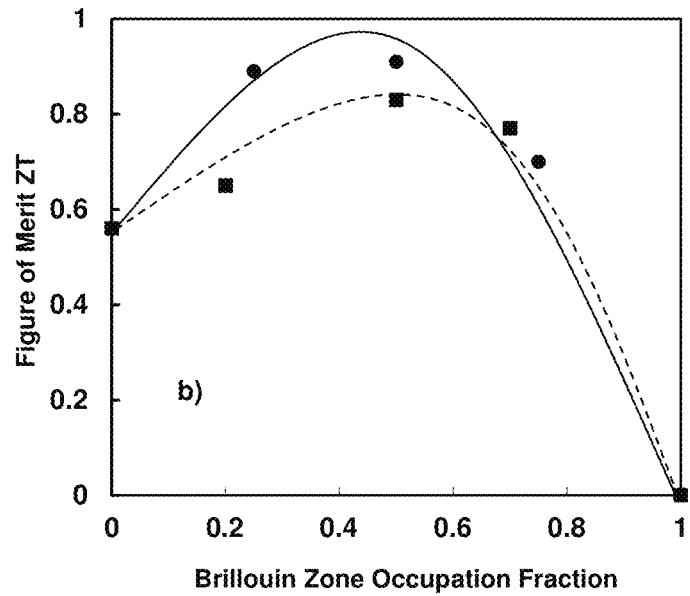
Figure 5A:
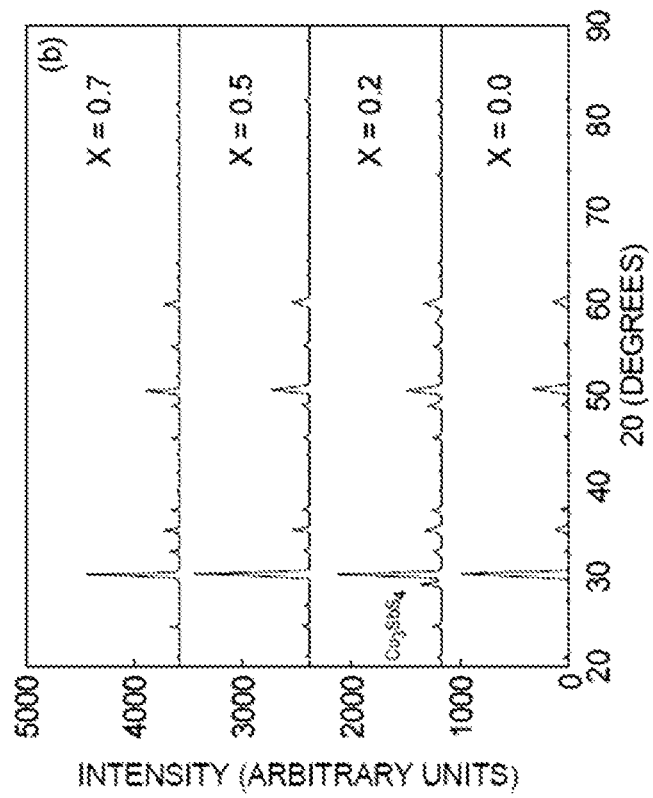
Figure 5B:
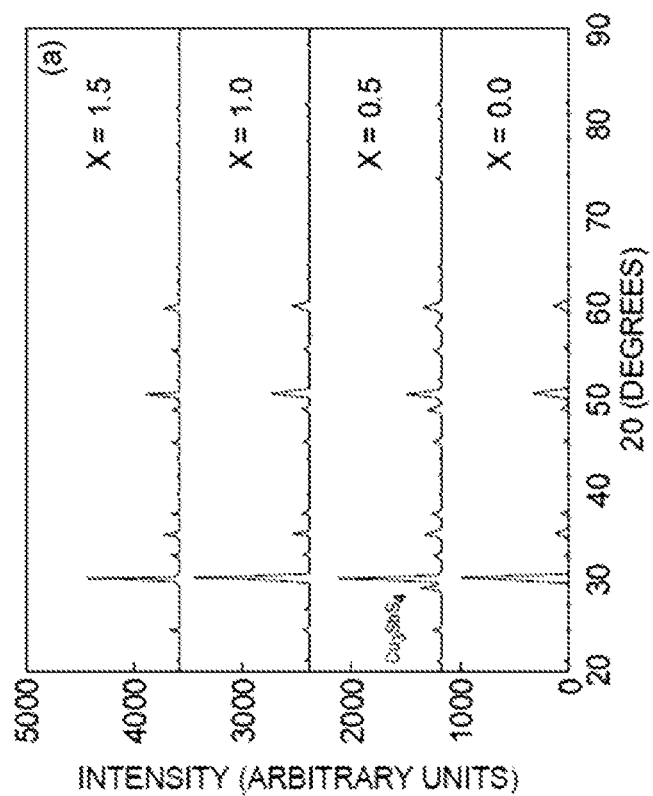
Figure 6A:
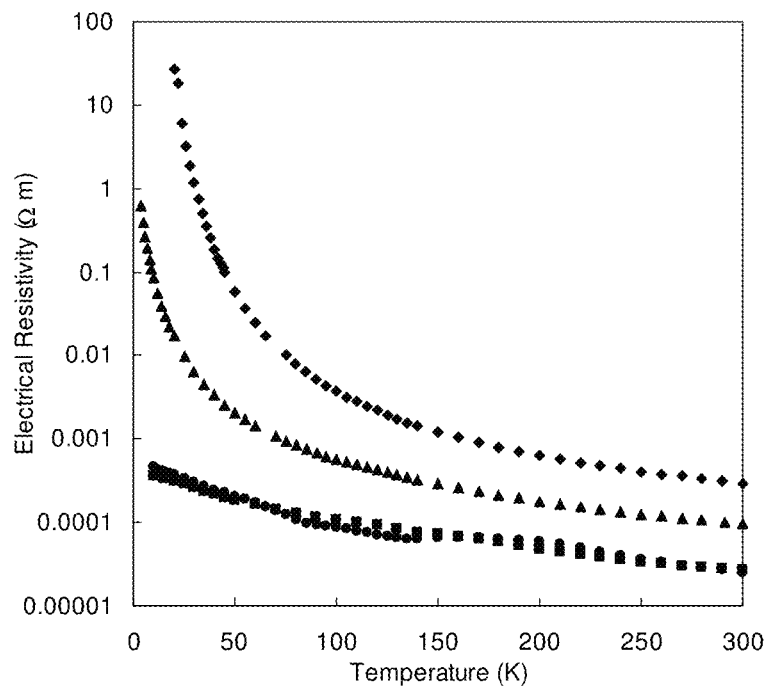
Figure 6B:
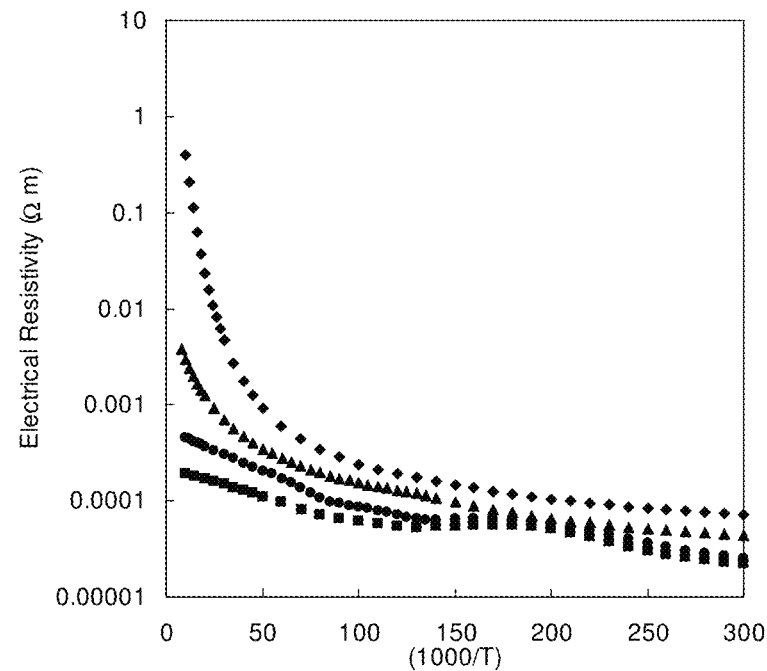
Figure 6C:
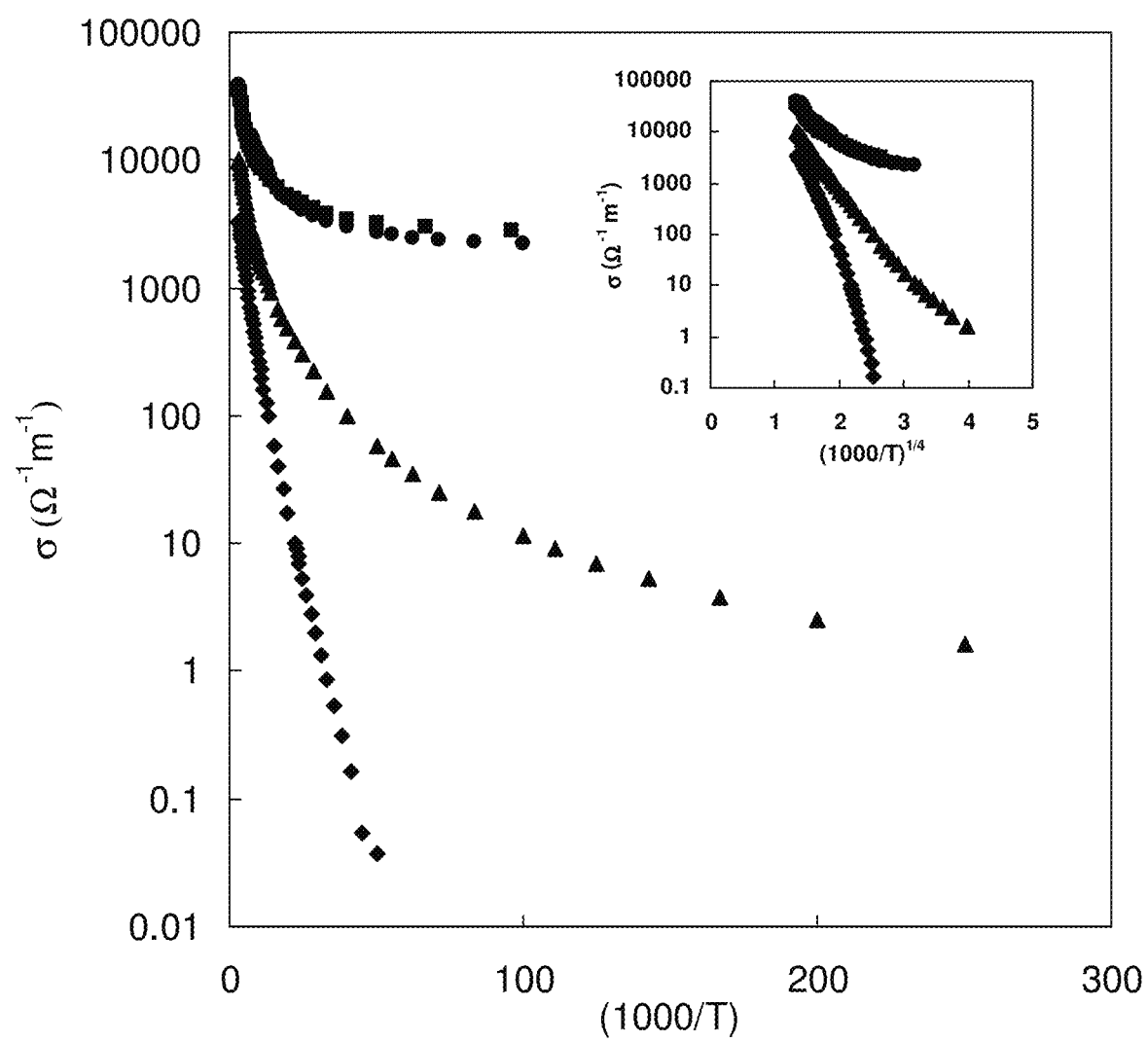
Figure 7:
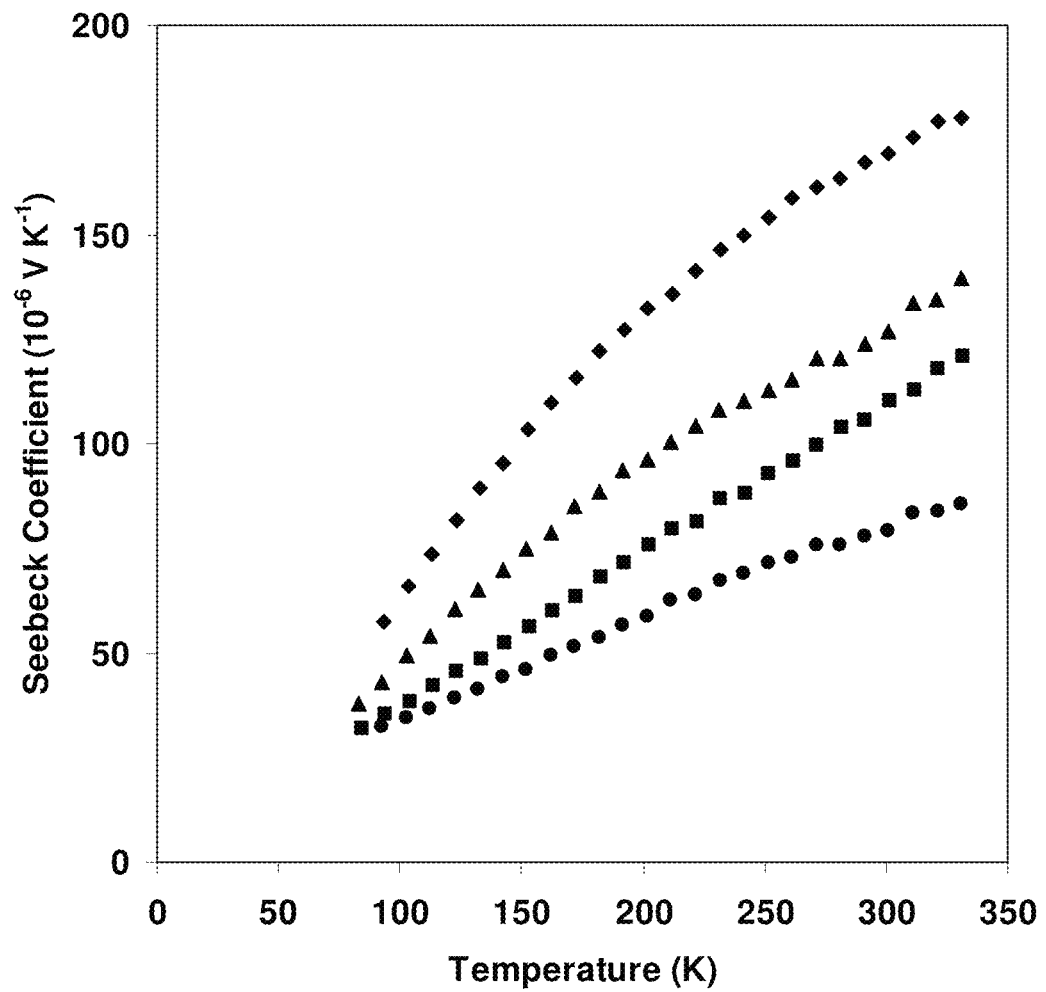
Figure 8:
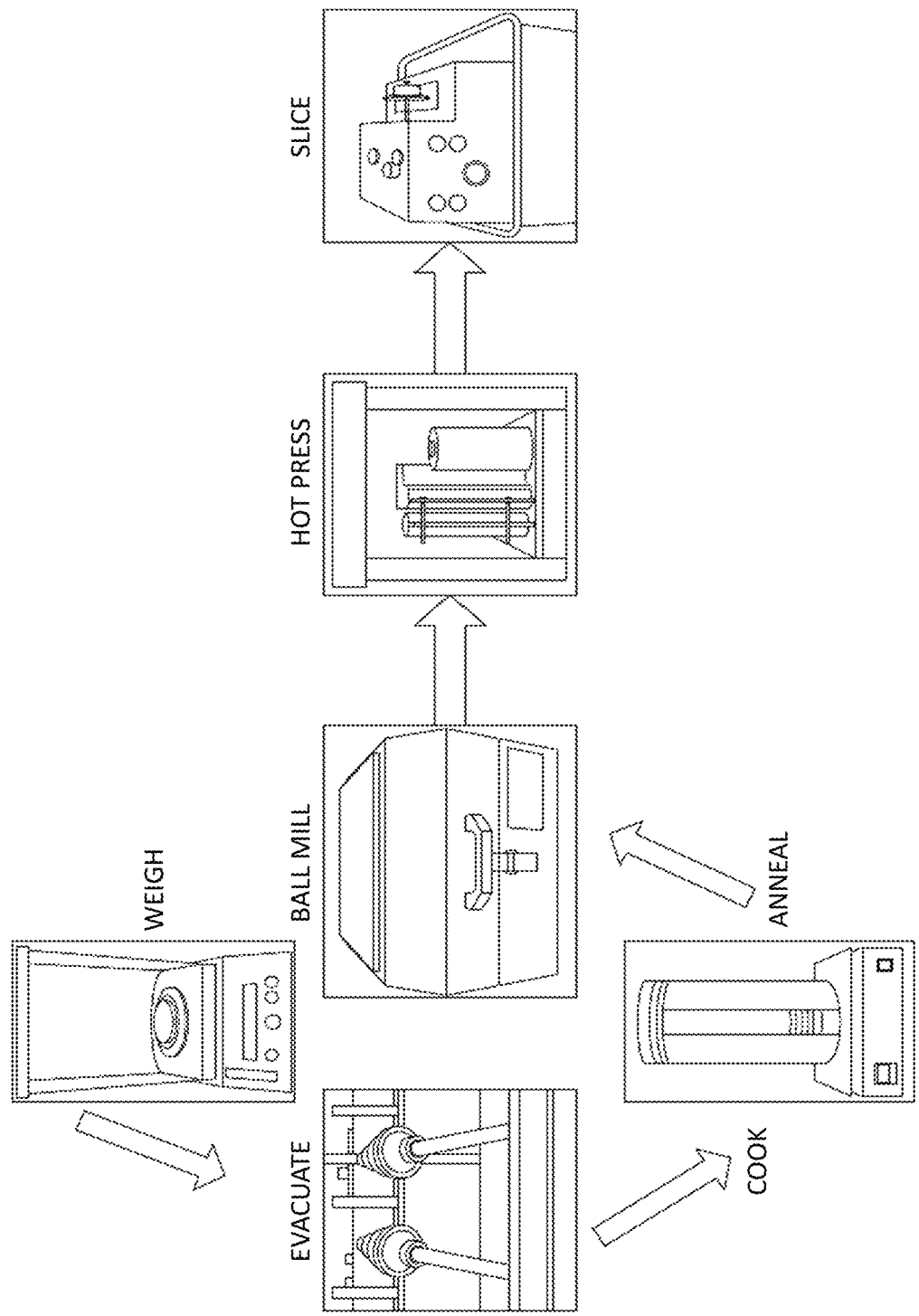
Figure 9:
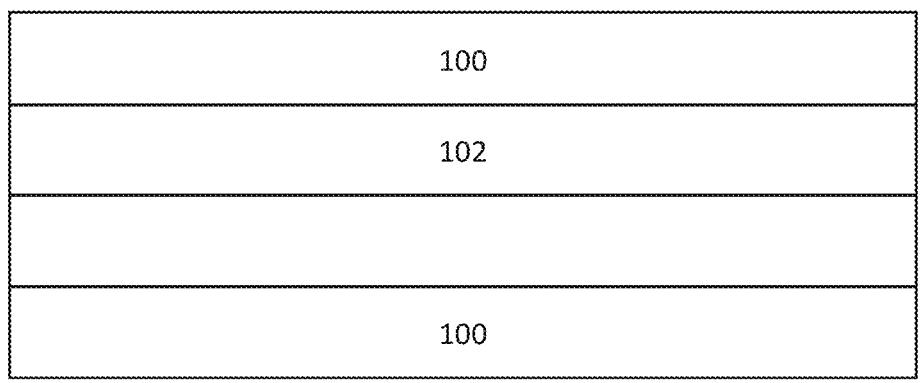
Figure 10:
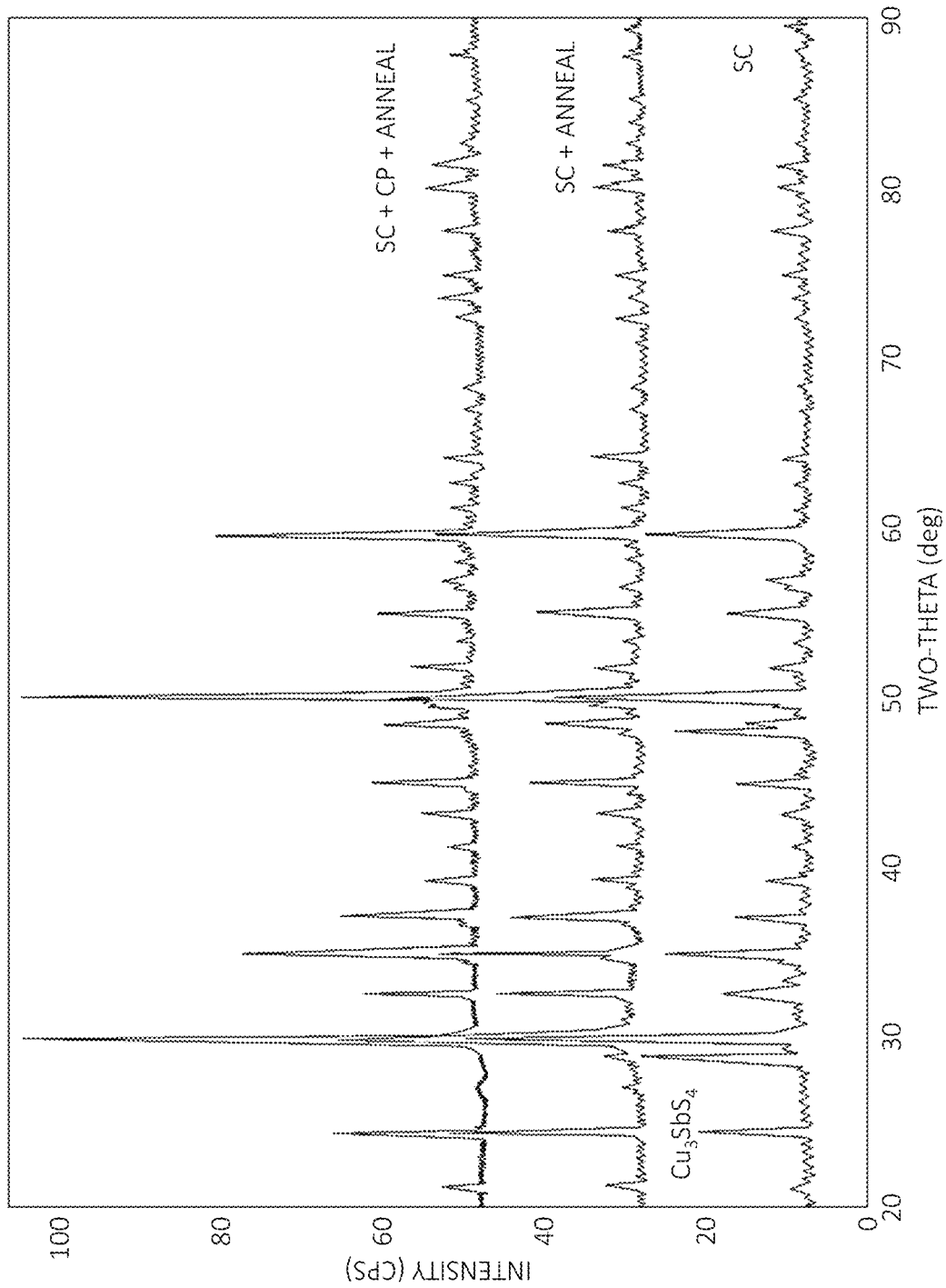
Figure 11:
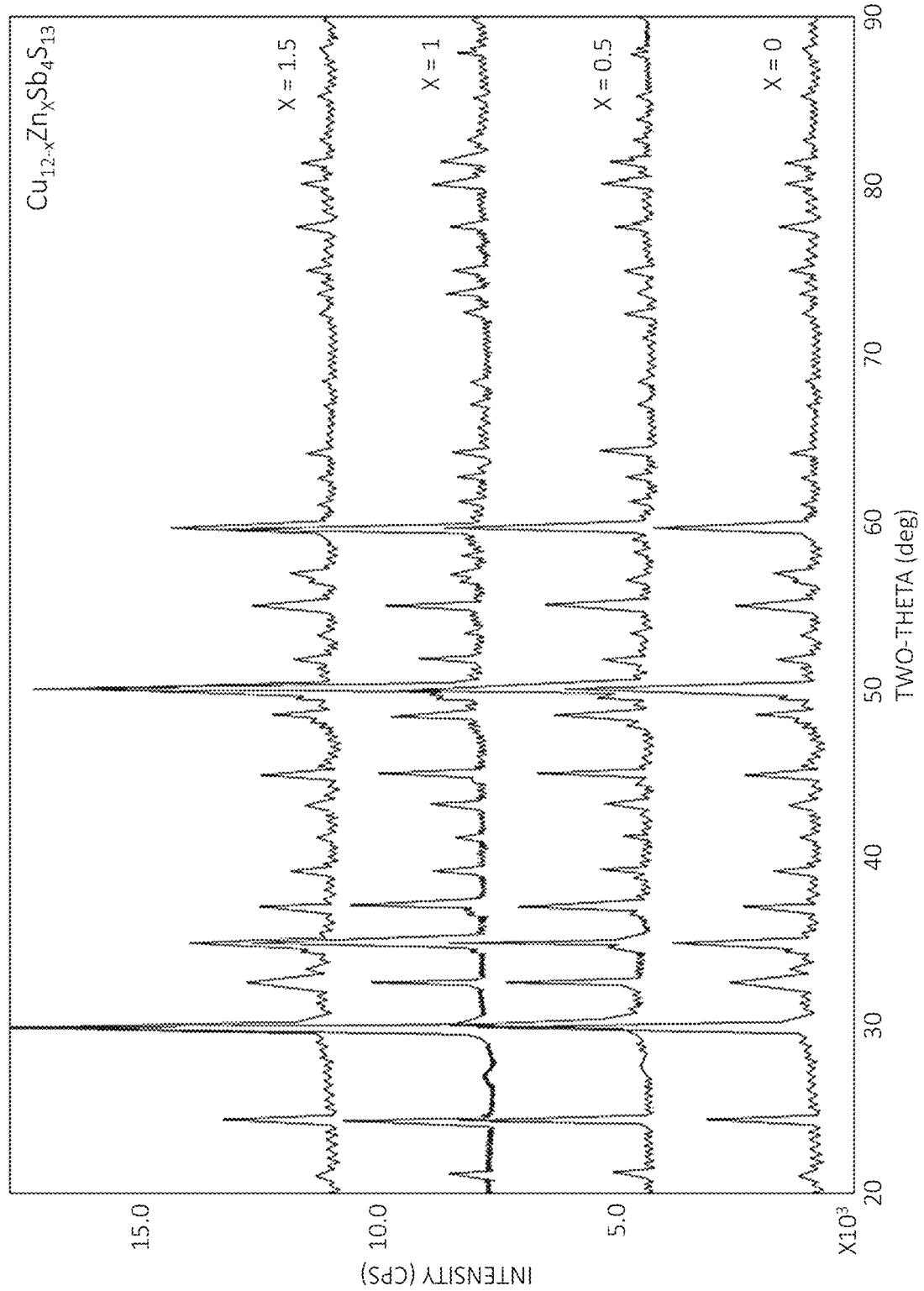
Figure 12:
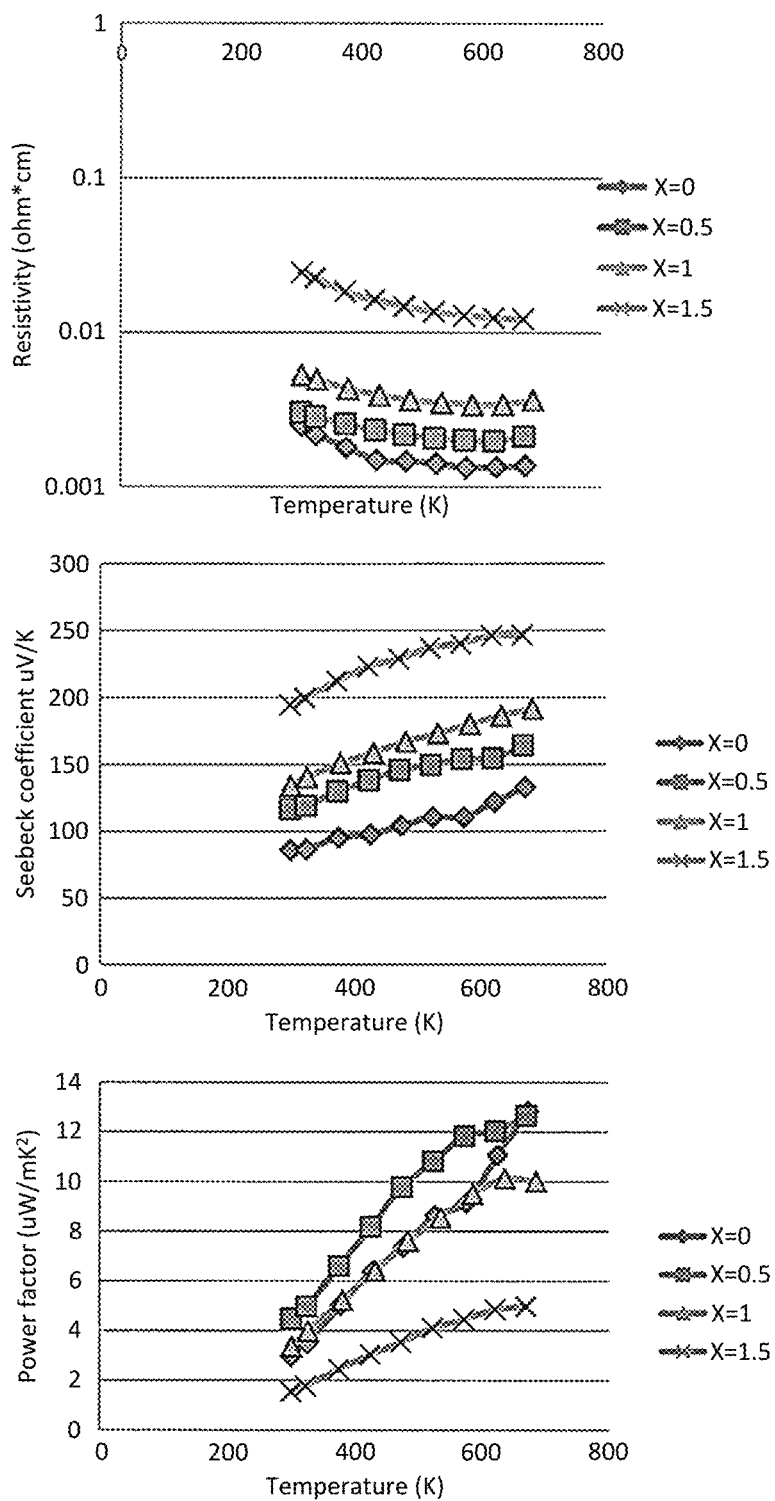
Figure 13:
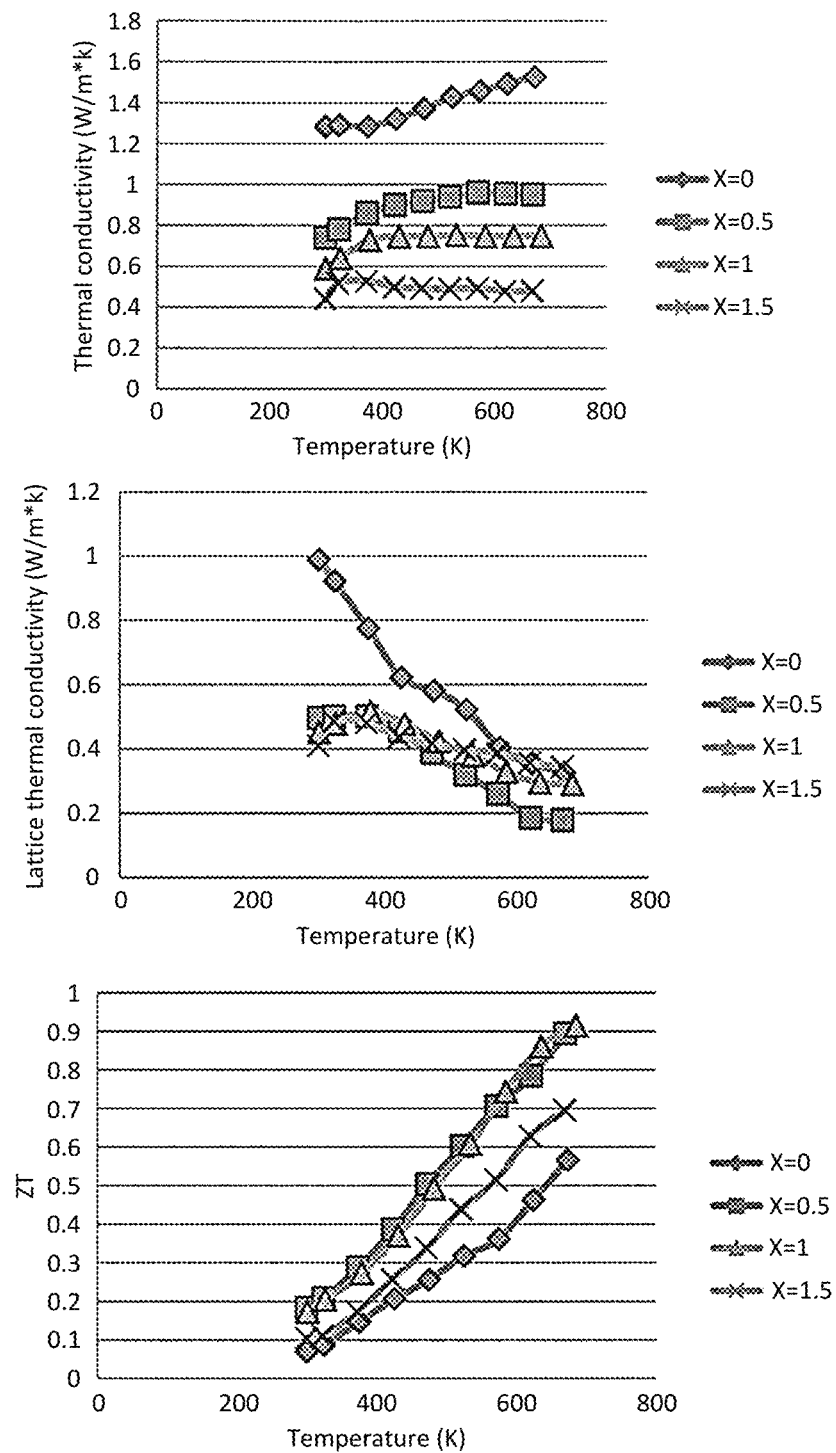
Figure 14:
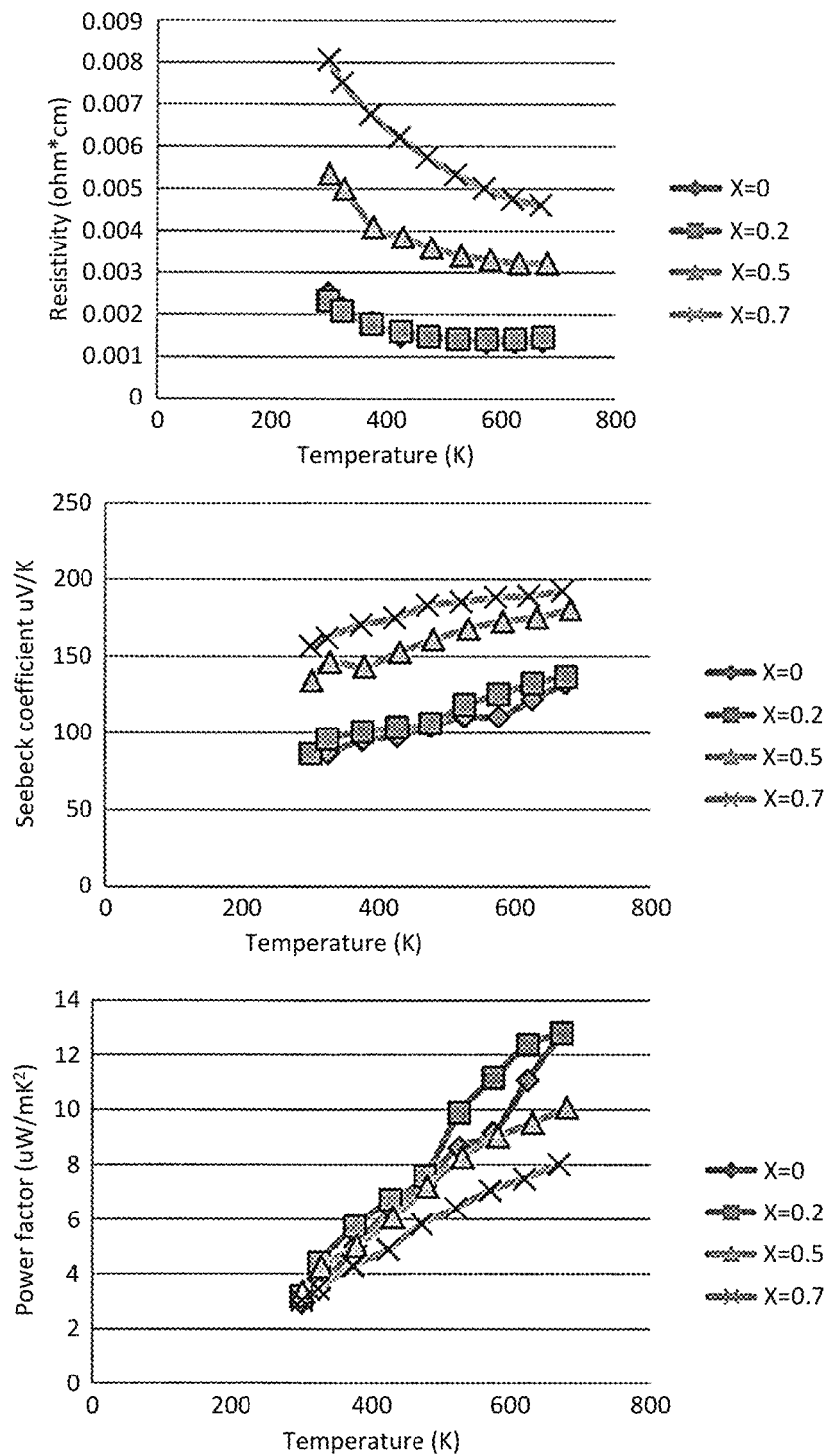
Figure 15:
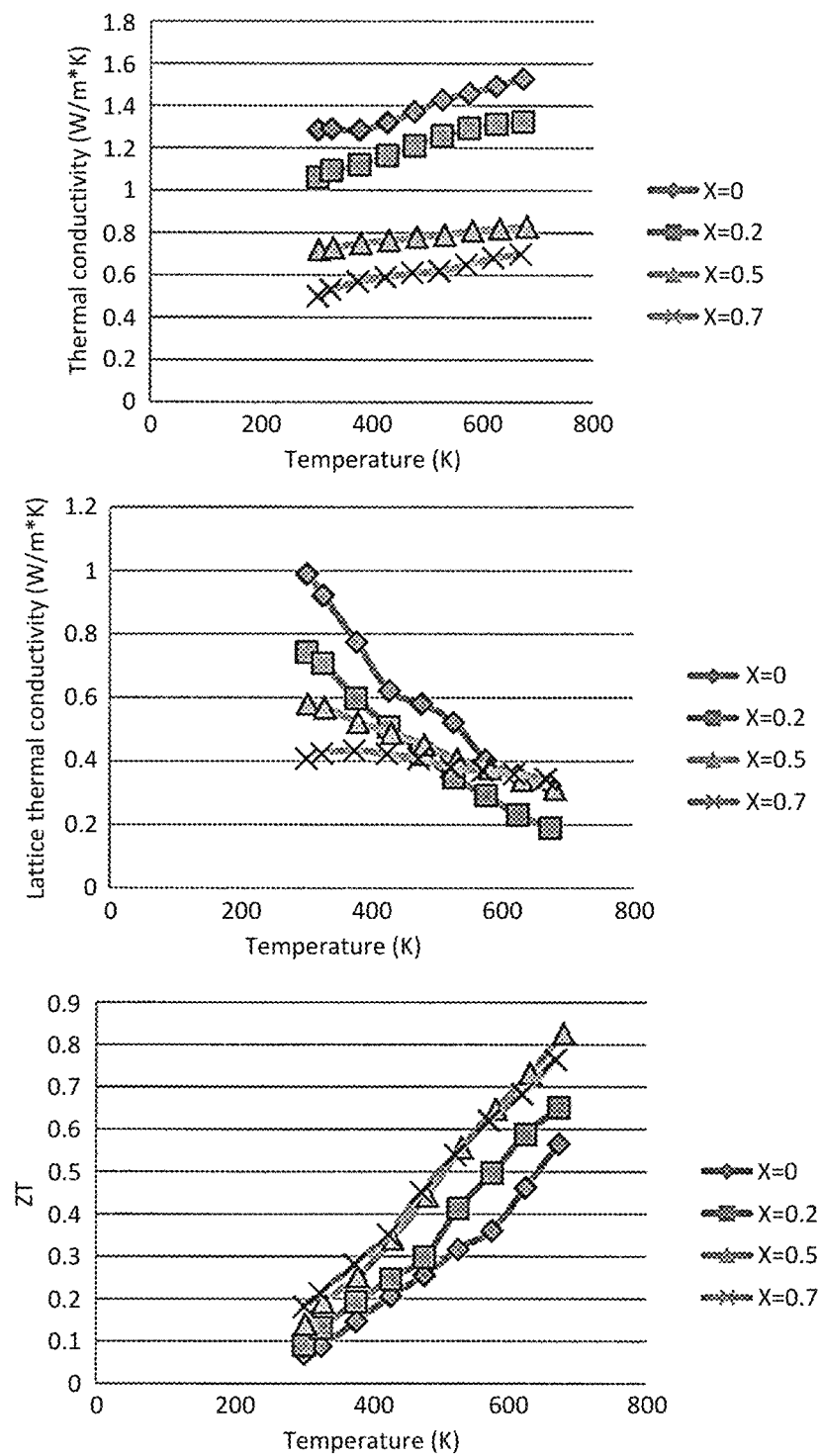
Figure 18:
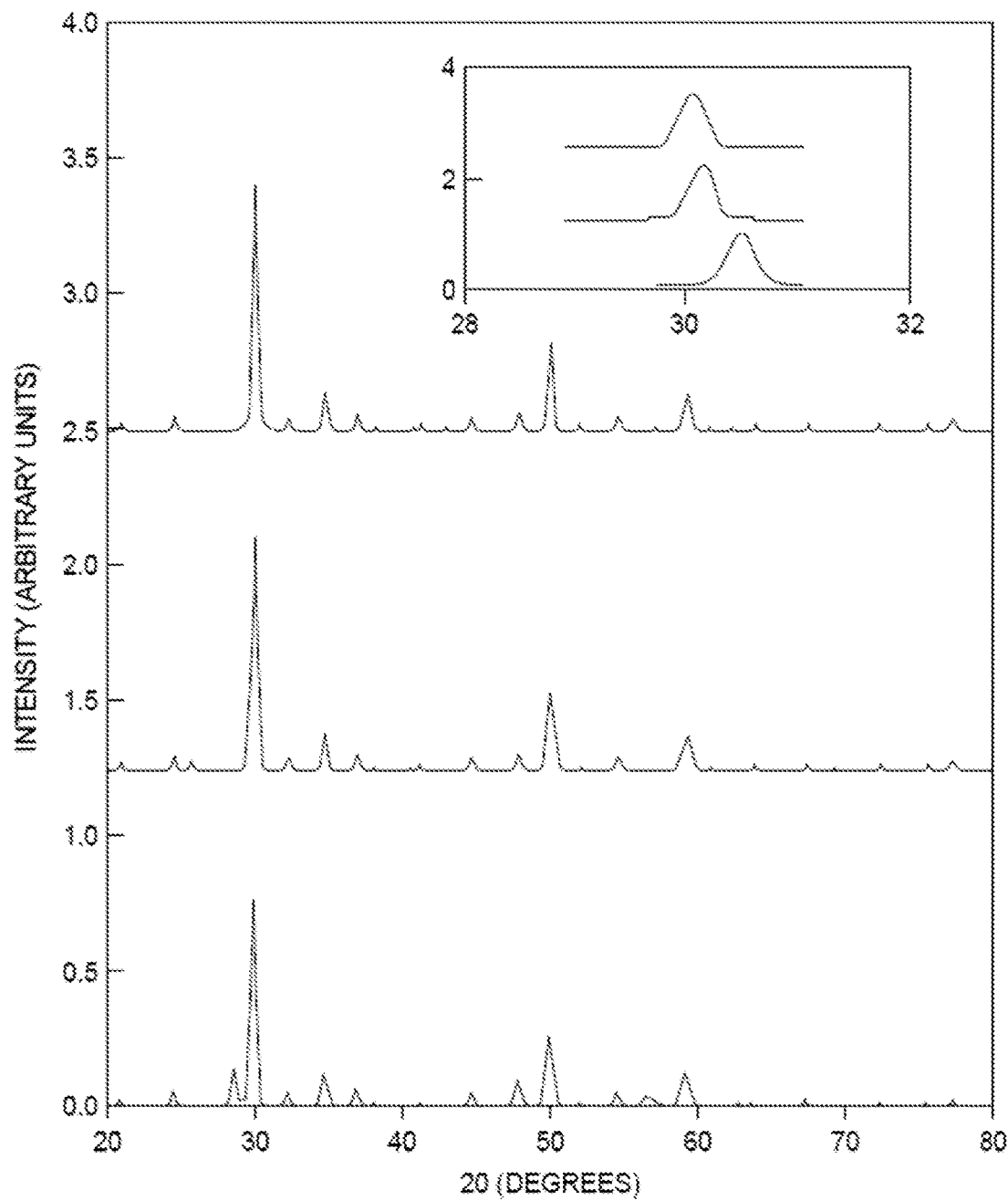
Figure 19:
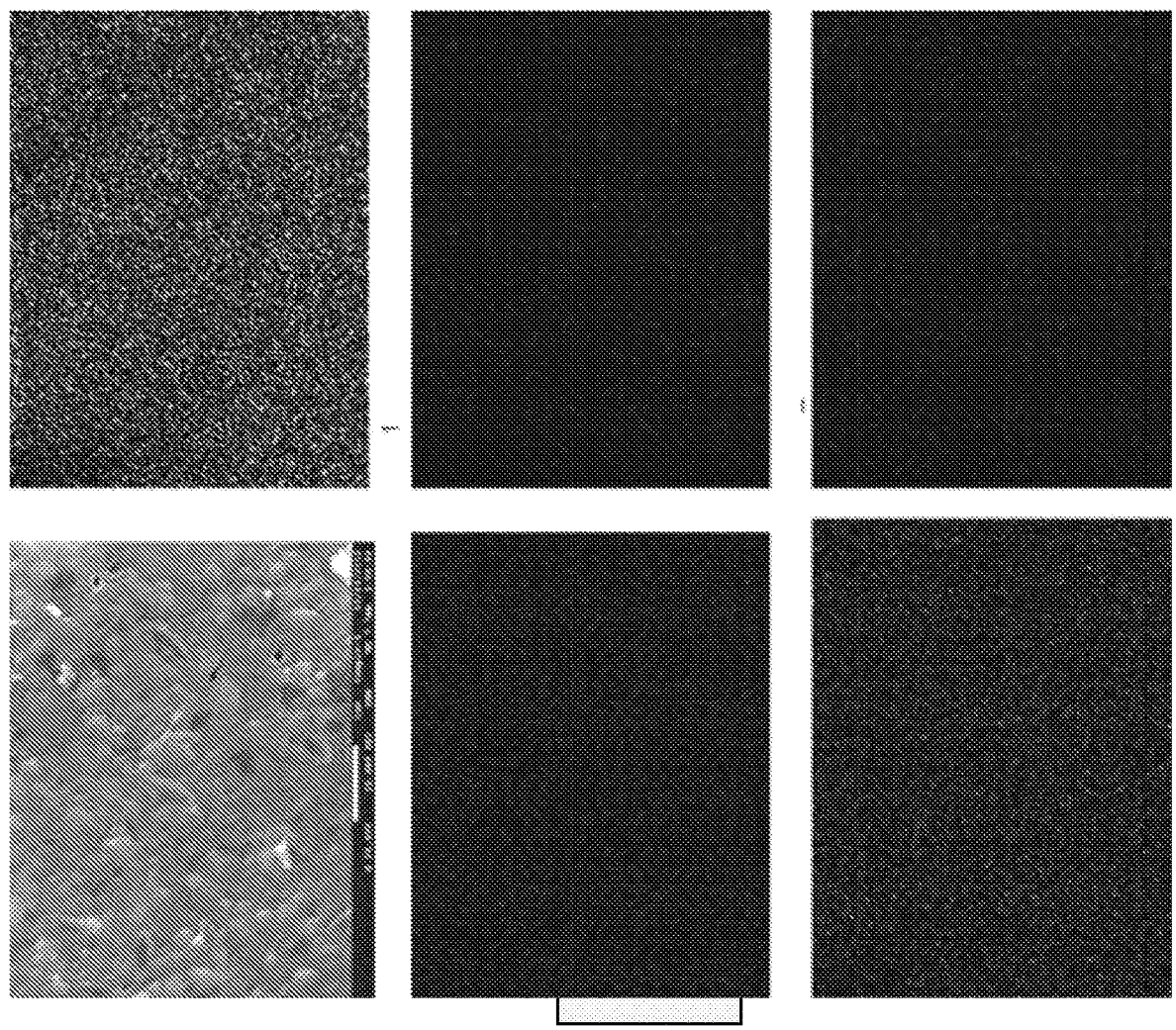
Figure 20:
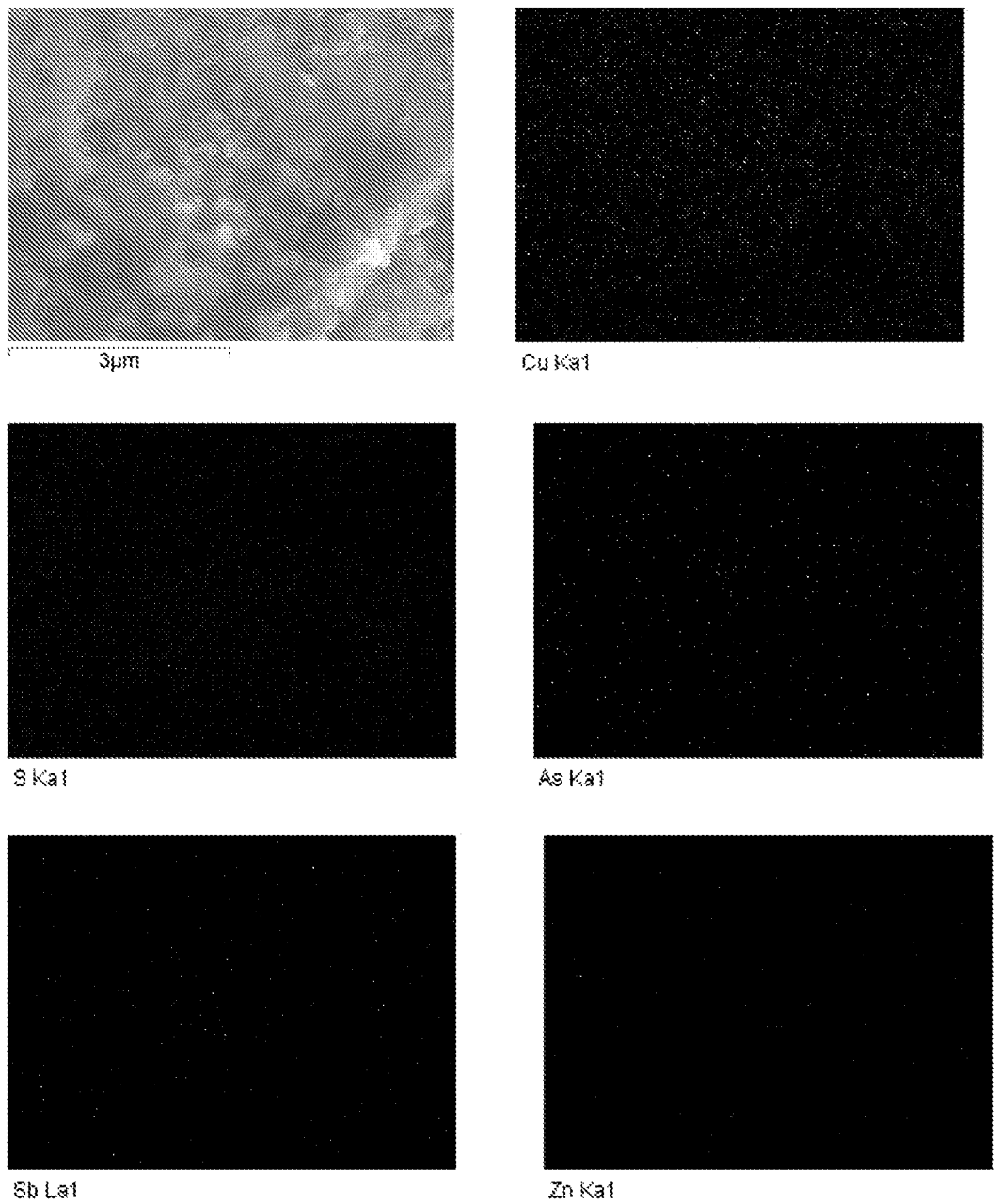
Figure 21:
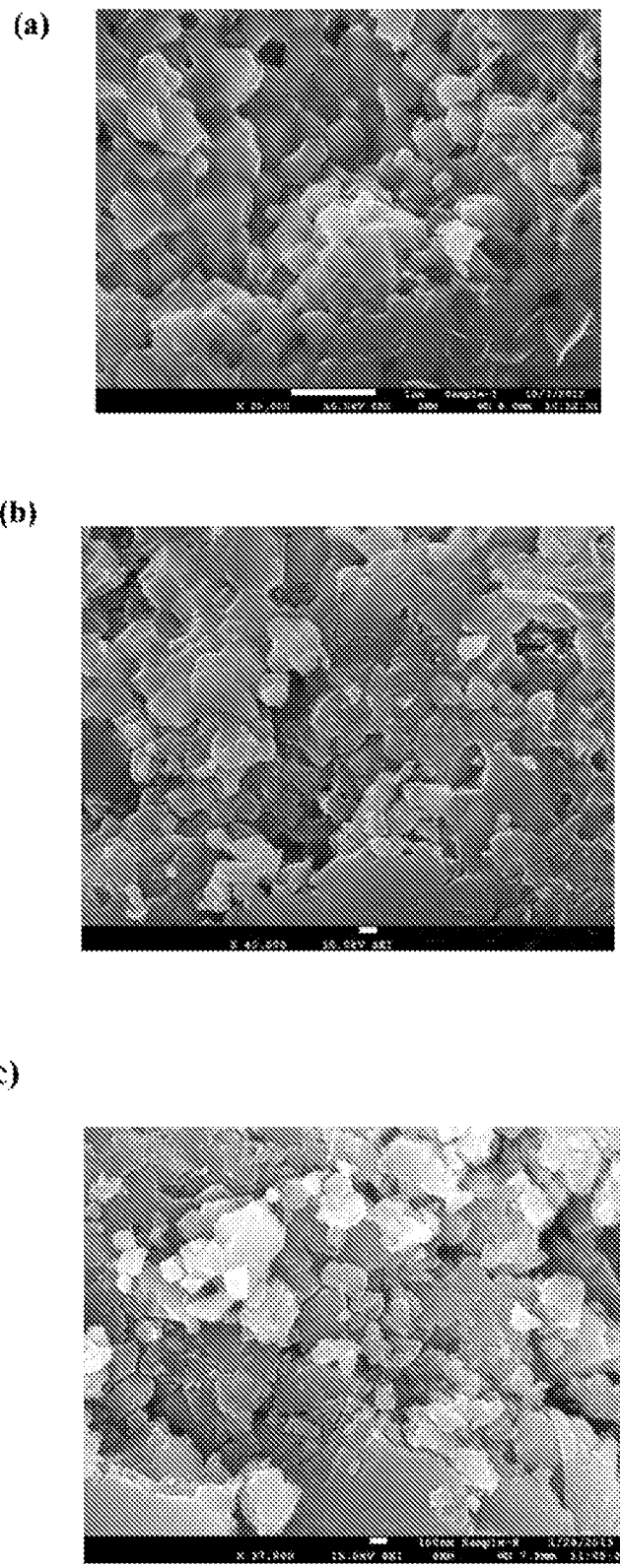
Figure 22:
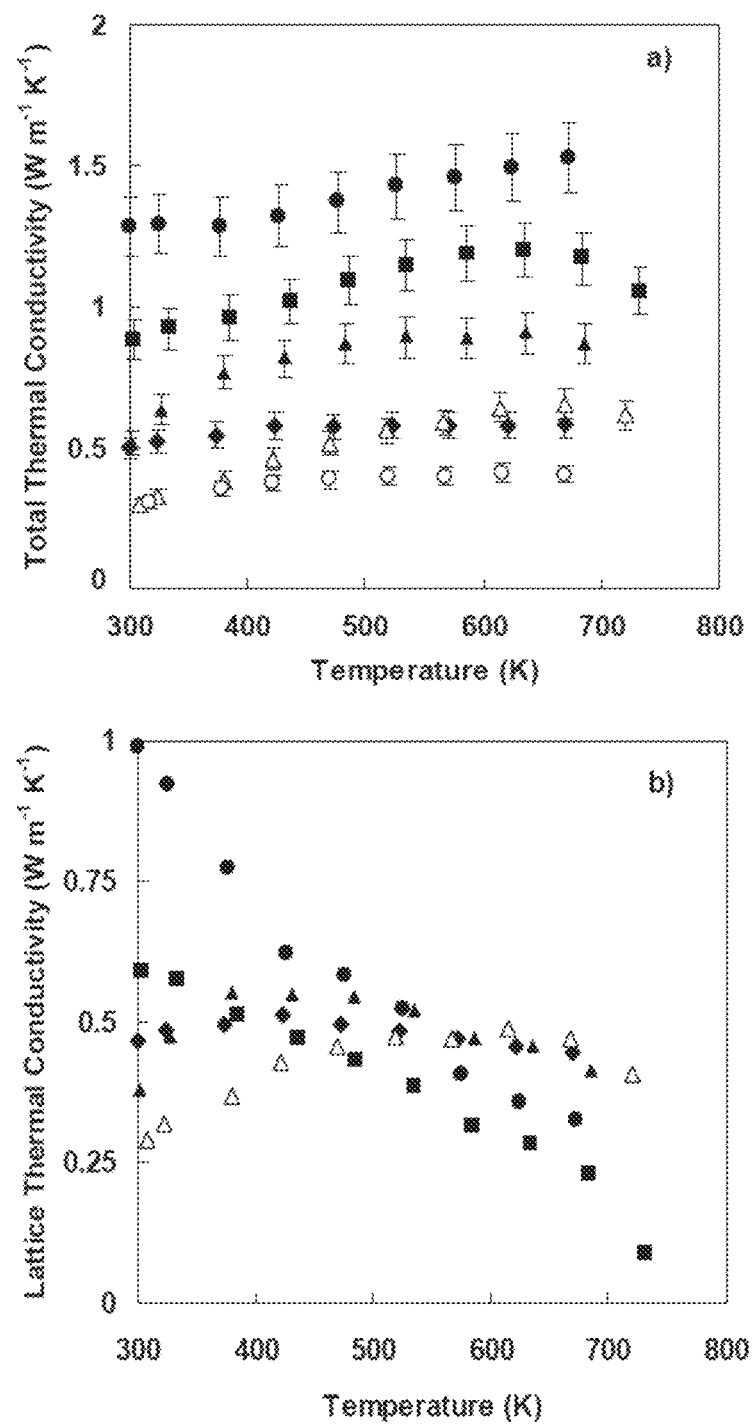
Figure 23:
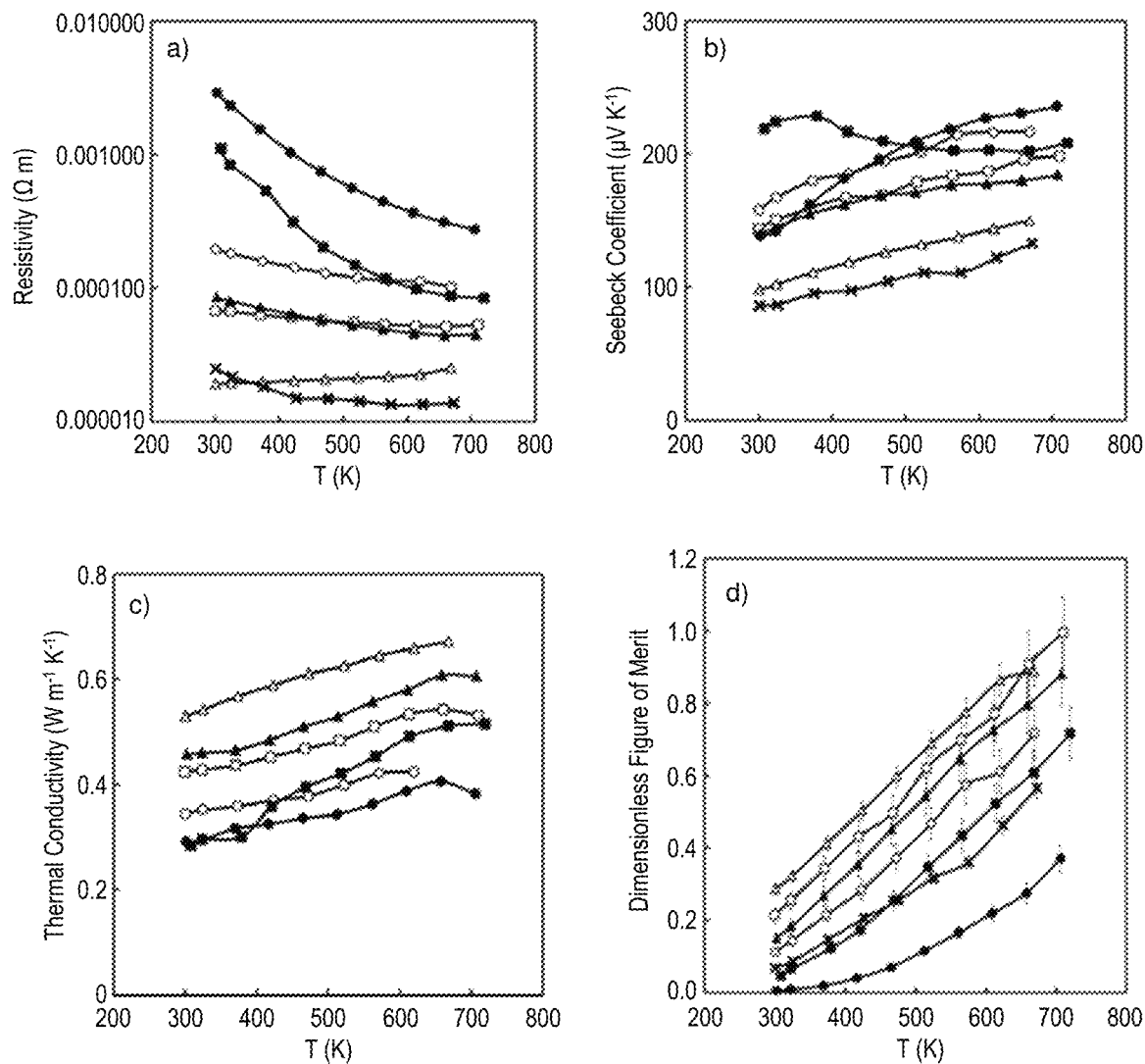

FIG. 3a total lattice thermal conductivities of $Cu_{12-x}Zn_xSb_4S_{13}$;

FIG. 3b represents lattice thermal conductivities of $Cu_{12-x}Zn_xSb_4S_{13}$;

FIG. 4a represents the dimensionless thermoelectric figure of merit ZT as a function of temperature for tetrahedrite $Cu_{12-x}Zn_xSb_4S_{13}$;

FIG. 4b represents a figure of merit versus Brillouin zone occupation number for $Cu_{12-x}M_xSb_4S_{13}$ (M=Zn, Fe);

FIGS. 5a and 5b represent X-ray diffraction patterns for a) $Cu_{12-x}Zn_{2-x}Sb_4S_{13}$ and b) $Cu_{12-x}Fe_{2-x}Sb_4S_{13}$ samples;

FIGS. 6a and 6b represent a) thermal diffusivity and b) specific heat capacity for synthetic tetrahedrite specimens;

FIG. 6c represents conductivity vs. $T^{-1}$ for the synthetic species;

FIG. 7 represents low temperature electrical conductivity versus inverse temperature for $Cu_{12-x}Zn_{2-x}Sb_4S_{13}$;

FIG. 8 represents a system for forming the materials according to the present teachings;

FIG. 9 represents a thermoelectric device according to the present teachings;

FIGS. 10 and 11 represent x-ray diffraction patterns for the disclosed materials under varying processing conditions;

FIGS. 12-17 represent various material properties for the materials disclosed herein;

FIG. 18 represents an x-ray diffraction pattern of various disclosed materials according to the present teachings;

FIGS. 19-21 represent SEM images of various materials according to the present teachings; and And FIGS. 22-23 represent material properties for the materials shown in FIGS. 19-21.

Corresponding reference numerals indicate corresponding parts throughout the several views of the drawings.

DETAILED DESCRIPTION

Example embodiments will now be described more fully with reference to the accompanying drawings. Thermoelectric materials can convert waste heat into electricity, potentially improving the efficiency of energy usage in both industry and everyday life. Unfortunately, known good thermoelectric materials often are comprised of elements that are in low abundance and/or toxic, and frequently require careful doping and complex synthesis procedures. Here, high thermoelectric figure of merit in compounds of the form $Cu_{12-x}TM_xSb_4S_{13}$, where TM is a transition metal, such as Zn or Fe. In these compounds the dimensionless figure of merit reaches 0.9 around 673K, comparable to that of other state of art p-type thermoelectric materials in the same temperature range. Importantly, the figure of merit remains high for a wide range of values of x. The subject compositions are among those that form the class of natural minerals known as tetrahedrites. Thermoelectrics comprised of earth-abundant elements will pave the way to many new, low cost thermoelectric energy generation opportunities.

Described below in detail is the synthesis and measurement of the thermoelectric properties of tetrahedrite-based compounds. Generally, pure $Cu_{12}Sb_4S_{13}$ exhibits a ZT value of 0.56 at 673K (400® C.). This pure 12-4-13 composition does not occur in natural minerals. Rather, natural tetrahedrite or ore is of typical composition $Cu_{12-x}M_xSb_4S_{13}$ and is a very commonly occurring sulfosalt, found quite typically with M=Zn, Fe, Hg and Mn. The most common substitution elements are Zn and Fe on Cu sites, up to 15% in the natural mineral ZT values of up to 0.91 near 673 K in $Cu_{12-x}(Zn, Fe)_xSb_4S_{13}$ with x=0-1.5 and x=0-0.7 for Zn and Fe, respectively have been measure. This result highlights the potential of directly using natural tetrahedrite minerals as source thermoelectric materials, without the need for time and energy consuming synthetic procedures or precise doping.

Figure 1:
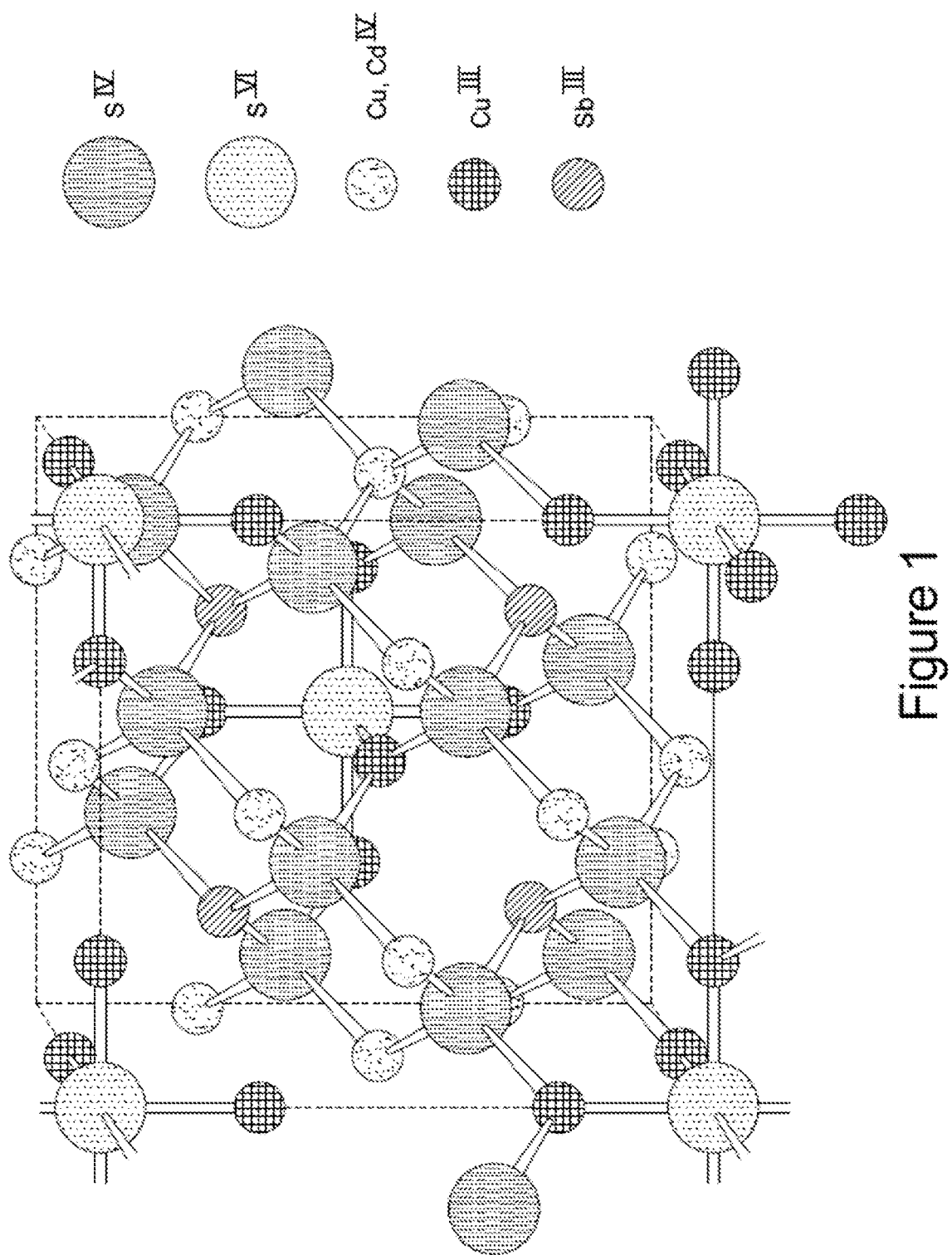
FIG. 1 represents a tetrahedrite structure according to the present teachings.
Figure 2A:
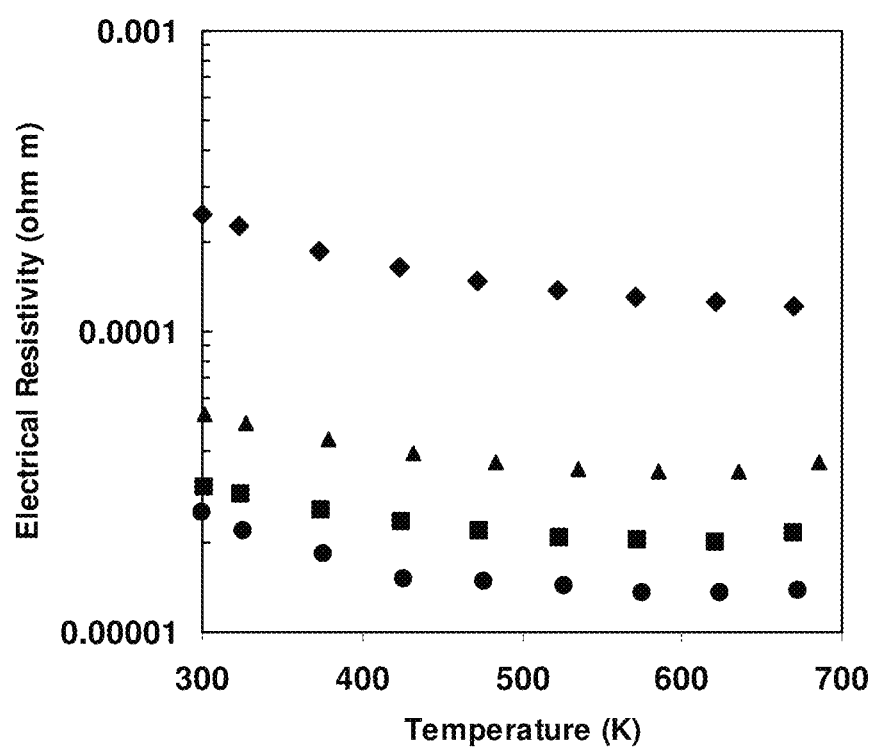
FIG. 2a represents an electrical resistivity of synthetic tetrahedrite of composition $Cu_{12-x}Zn_xSb_4S_{13}$ above room temperature.

Pure $Cu_{12}Sb_4S_{13}$ and compounds with substitution of Fe and Zn on the Cu site were synthesized using a vacuum, annealing, and hot-pressing procedure. The samples are single phase and at a density of ≥95%, and preferably ≥98% theoretical density. FIG. 2a shows the electrical resistivity of $Cu_{12-x}Zn_xSb_4S_{13}$ in the temperature range 373 K-673 K with x ranging from 0 to 1.5. The low temperature resistivity shows semiconductor-like characteristics but it cannot be fit with a simple activated behavior; rather, the conductivity behavior is more consistent with a hopping-type mechanism. Attempts to measure hole concentration using the Hall effect proved unsuccessful; even in large field a Hall coefficient $R_H$ close to zero is measured. In terms of the crystal-chemical argument given above, this would imply that at least some of the nominally divalent Cu ions are in a monovalent or mixed valent state, giving rise to a partially filled Brillouin zone and metallic behavior.

The band structure calculations show that $Cu_{12}Sb_4S_{13}$ is a metal. In pure and lightly Zn-substituted samples (x=0, 0.5 and 1), resistivities are on the order of $10^{-3}$ ohm cm, which are comparable to other good thermoelectric materials. When the Zn content is increased to x=1.5, the resistivity increases by one order compared to the pure sample, and found that for a Zn-substituted sample with x=2.0 the material is electrically insulating. Since it is expected that the Zn ion will be strictly in the $Zn^{2+}$ state, this is consistent with the replacement of all nominal $Cu^{2+}$ ions with $Zn^{2+}$ ions, complete filling of the Brillouin zone, and the occurrence of a true semiconducting state.

As the Zn concentration is increased the Seebeck coefficient (FIG. 2b) rises considerably, exceeding 200 $\mu VK^{-1}$ at the highest temperatures for the x=1.5 sample. This is consistent with the filling of holes in the valence band as zinc replaces copper. Below room temperature the Seebeck coefficient decreases smoothly toward zero. Above room temperature, with resistivity values in the $10^{-3}$ ohm cm range and Seebeck coefficients ~100-200 $\mu VK^{-1}$, these tetrahedrites have thermoelectric power factors, comparable to some of the best thermoelectric materials, like PbTe, in this temperature range.

Turning now to the thermal conductivity, FIG. 3a displays thermal conductivity derived from thermal diffusivity measurements above room temperature. The thermal conductivity is below 1.5 W $m^{-1}$ $K^{-1}$ over the entire temperature range. The thermal conductivity falls monotonically with increasing Zn substitution. This reflects the combined effects of a reduced electronic component of thermal conductivity and a decreasing lattice contribution. If applied, the Wiedemann-Franz law estimates the electronic contribution, extracted is the lattice thermal conductivity of the samples. These results are shown in FIG. 3b. As shown, while the pure sample still has a decreasing lattice thermal conductivity with increasing temperature, the Zn-substituted samples all have lattice thermal conductivity in the range of 0.2-0.5 W $m^{-1}$ $K^{-1}$, and in fact even the pure tetrahedrite sample falls into this range at the highest temperature. This value of lattice thermal conductivity is close to the "minimal" thermal conductivity for a phonon mean free path equal to the interatomic spacing.

In order to help understand the low thermal conductivity in tetrahedrites, phonon dispersion calculations were performed, including calculations of the mode Grüneisen parameters, a prominent feature of the phonon dispersion is the strongly anharmonic vibrations arising. Since the intrinsic phonon scattering rates are proportional to the square of the Grüneisen parameter, this highly anharmonic behavior will produce strong intrinsic phonon scattering and large thermal resistance in these compounds The combination of high thermoelectric power factor and low thermal conductivity in these compounds leads to large thermoelectric figure of merit (FIG. 4a). Although the power factor of the x=1.5 sample is less than half that of the x=0 sample, the ZT value at x=1.5 is still higher than that of pure sample, approaching 0.7 at 673K. The maximum ZT value of 0.91 is attained for x=1. The high ZT values are maintained for relatively large Zn substitutions due to the compensating effect from the reduction in thermal conductivity. As can be seen from FIG. 4a, the total thermal conductivity of the x=1.5 sample was reduced to one third of that of pure sample at high temperature. The reduction in total thermal conductivity can be mainly attributed to the decreased electronic thermal conductivity. Because the lattice thermal conductivity in these compounds is so low, reducing the power factor actually leads to a 60% enhancement in ZT value for the case of the x=1 for Zn substitution, due to reduction in electronic thermal conductivity.

Also measured the thermoelectric properties of $Cu_{12-x}Fe_xSb_4S_{13}$ (x=0.2, 0.5, and 0.7). Like their Zn substituted counterparts, the Fe substituted samples display similar trends of an increase in resistivity, enhancement in the Seebeck coefficient and reduction in the total thermal conductivity. The ZT value reaches a maximum value of 0.83 at x=0.5 and decreases for higher values of x. Interestingly, the resistivity of $Cu_{11}FeSb_4S_{13}$ is three orders of magnitude larger than that of $Cu_{12}Sb_4S_{13}$. This difference between Fe and Zn substitution has its origin in the different valence states of Fe and Zn in tetrahedrite, where Fe in synthetic $Cu_{12-x}Fe_xSb_4S_{13}$ is trivalent between for $0<x<1$ and divalent for $1 \leq x \leq 2$. This implies that, in the x range measured here, each Fe atom can provide an extra electron to fill the Brillouin-zone compared to each Zn atom, and explains why Fe substitution causes a larger increase in resistivity for the same x value.

In order to understand the relationship between filling of the Brillouin-zone and the resulting ZT values, the notion of the occupation fraction of the Brillouin-zone: occupation fraction=number of substituting atoms*contributed electrons/2. For example, for x=0.5 Fe substitution, the fraction is 0.5 while for x=0.5 Zn substitution, the fraction is 0.25. FIG. 4b displays the relationship between occupation fraction and the measured ZT values. For both substitutions, the maximum ZT values are reached at 0.5 and ZT begins to diminish for higher occupation fraction. From this plot, ZT values above 0.6 can be attained over a surprisingly large range of Brillouin zone occupation; high ZT is extremely robust against impurity substitution on the copper site in $Cu_{12}Sb_4S_{13}$, with high values maintained up to occupation fraction of 0.8, even if the substitution is a mixture of more than one kind of atom. Since this range of substitution over which high ZT is maintained exceeds significantly the range of composition of natural tetrahedrites, it is quite likely that natural mineral tetrahedrites can be used directly as thermoelectric materials.

Synthesized single phase and high density Zn and Fe substituted $Cu_{12}Sb4S_{13}$ provides preferred thermoelectric properties. The intrinsic low lattice thermal conductivities give birth to high ZT values comparable to state of art thermoelectric materials in the range of 600-700 K. The maximum ZT values are 0.91 and 0.83 for Zn and Fe substitutions, respectively. A thermoelectric figure of merit above 0.6 can be maintained over a large range of substitution level, and is related to the occupation fraction of Brillouin-zone. Unlike traditional thermoelectric materials that require careful control over doping level and synthesis conditions, the mineral tetrahedrite can likely be used with little processing effort as an earth-abundant resource for high performance thermoelectricity.

Optionally, the material can be formed by ball milling and more particularly by high energy ball milling. Ball milling (and in particular High-energy ball milling) represents a way of inducing phase transformations in starting powders whose particles have all the same chemical composition. For example, amorphization or polymorphic transformations of compounds, disordering of ordered alloys can be produced. Although the principles of these operations are same for all the techniques, this alloying process can be carried out using different apparatus, namely, attritor, planetary mill or a horizontal ball mill. The powders are cold welded and fractured during mechanical alloying, it is critical to establish a balance between the two processes in order to alloy successfully.

The ball mill system has a turn-table and two or rotatable four bowls. The turn-table rotates in one direction while the bowls rotate in the opposite direction. The centrifugal forces, created by the rotation of the bowl around its own axis together with the rotation of the turn disc, are applied to the powder mixture and milling balls in the bowl. The powder mixture is fractured and cold welded under high energy impact.

Since the rotation directions of the bowl and turn-table are opposite, the centrifugal forces are alternately synchronized. Thus friction resulted from the hardened milling balls and the powder mixture being ground alternately rolling on the inner wall of the bowl and striking the opposite wall. The impact energy of the milling balls in the normal direction attains a value of up to 40 times higher than that due to gravitational acceleration. Hence, the planetary ball mill can be used for high-speed milling. During the ball milling process, the powder particles are subjected to high energetic impact. Microstructurally, the mechanical alloying process can be divided into several stages: mixing stage, intermediate stage, final stage, and completion stage.

At the mixing stage of ball milling, the powder particles dispersed and are flattened by the compressive forces due to the collision of the balls. Micro-forging leads to changes in the shapes of individual particles, or cluster of particles being impacted repeatedly by the milling balls with high kinetic energy. No net change in mass for the powders occurs. In the intermediate stage of the mechanical alloying process, significant changes occur in comparison with those in the initial stage. Cold welding is now significant. The intimate mixture of the powder constituents decreases the diffusion distance to the micrometer range. Fracturing and cold welding are the dominant milling processes at this stage. Although some dissolution may take place, the chemical composition of the alloyed powder is still not homogeneous.

In the final stage of the mechanical alloying process, considerable refinement and reduction in particle size is evident. The microstructure of the particle also appears to be more homogenous in microscopic scale than those at the initial and intermediate stages. True alloys may have already been formed. In the completion stage of the mechanical alloying process, the powder particles possess an extremely deformed metastable structure. The lamellae are no longer resolvable by optical microscopy. Further mechanical alloying beyond this stage cannot physically improve the dispersoid distribution. Real alloy with composition similar to the starting constituents is thus formed.

Predicting nonequilibrium phase transitions under milling is not possible because mechanical alloying of materials are complex processes which depend on many factors. For instance phase transitions can depend on physical and chemical parameters such as the precise dynamical conditions, temperature, nature of the grinding atmosphere, chemical composition of the powder mixtures, chemical nature of the grinding tools, etc. It has been found that by starting with mineral tetrahedrite, materials added to the high energy mill will form into the same tetrahedrite structure. As such, by using a "starter" crystal structure from a natural or laboratory produced material, large volumes of specific crystals can be formed using this method.

In this regard, high energy ball milling can be used to form a powdered material having a crystal structure and a first stoichiometric ratio. To form this material, a first portion of a first material having the crystal structure and a second stoichiometric ratio is placed in a high energy ball mill with a second portion of a second material formed of a mixture of powder materials having a third stoichiometric ratio. The first and second portions of the materials hard high energy ball milled together to form a third portion of the powdered material having the crystal structure having the first stoichiometric ratio.

It is envisioned that stoichiometric ratios can be varied. For example, the second stoichiometric ratio can be the first stoichiometric ratio, or the third stoichiometric ratio can different than the second stoichiometric ratio. Further, as described below, the first portion can contain a naturally occurring ore. To maintain the crystal structure and reduce the number of secondary crystal structures, the first portion can be more than 50% by weight of the third portion. This methodology can be used to form for instance materials having complex crystal structures such as tetrahedrite powder of $Cu_{12-x}M_xSb_4S_{13}$ wherein M is selected from the group of Zn at a concentration $0<x<2.0$, Fe at a concentration $0<x<1.5$, and combinations thereof.

FIG. 2a represents the Electrical resistivity of synthetic tetrahedrite of composition $Cu_{12-x}Zn_xSb_4S_{13}$ above room temperature (circles: x=0; squares: x=0.5; triangles: x=1.0; diamonds: x=1.5). Low temperature resistivity shows that the resistivity decreases strongly with increasing temperature and is consistent with a hopping-type mechanism. At high temperature, the magnitude of the resistivity is in the range typical of good thermoelectric materials. For higher Zn substitution, holes in the valence band are filled and the material becomes insulating for x=2.

Figure 2B:
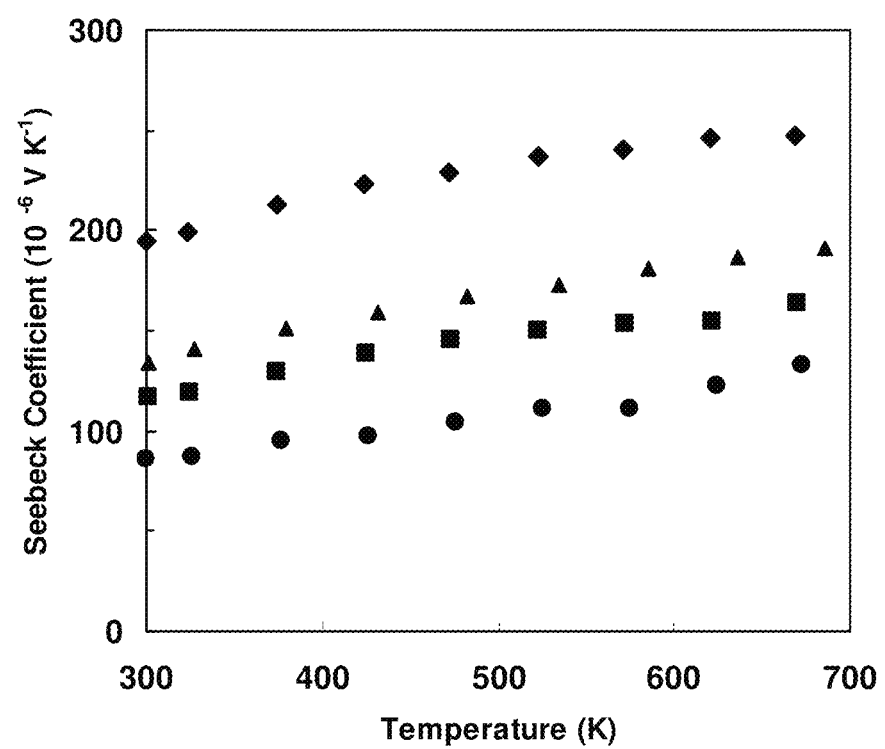

FIG. 2b shows the Seebeck coefficient of tetrahedrite of composition $Cu_{12-x}Zn_xSb_4S_{13}$; sample designation as in FIG. 2a. Seebeck coefficient rise strongly with temperature and Zn content, reaching values in excess of 200 uV $K^{-1}$.

FIG. 3a represents the total thermal conductivities of $Cu_{12-x}Zn_xSb_4S_{13}$, while FIG. 3b represents lattice thermal conductivities of $Cu_{12-x}Zn_xSb_4S_{13}$. The magnitude of the conductivity is comparable to or even smaller than typical thermoelectric materials like lead telluride or skutterudite. Zn-containing samples approach minimal thermal conductivity values over most of the temperature range, as does pure tetrahedrite at the highest measurement temperatures.

FIG. 4a represents Dimensionless thermoelectric figure of merit ZT as a function of temperature for tetrahedrite $Cu_{12-x}Zn_xSb_4S_{13}$. ZT rises with increasing Zn content up to x=1.0, but stays large even for x=1.5. Because the lattice thermal conductivity of these compounds is so small, the electronic thermal conductivity plays a special role in controlling their thermoelectric properties. With increasing Zn content, the resistivity rises, causing the power factor to decrease, but this is more than made up for by a decrease in electronic thermal conductivity.

FIG. 4b represents of merit versus Brillouin zone occupation number for $Cu_{12-x}M_xSb_4S_{13}$ (M=Zn, Fe). ZT reaches a maximum at smaller concentrations for Fe due to its variable valence state. $Cu_{12}(Fe,Zn)_2Sb_4S_{13}$ samples were synthesized by direct reaction of the starting elements—Cu (99.99%, Alfa-Aesar), Sb (99.9999%, Alfa-Aesar), and S, Zn, Fe (99.999%, Alfa-Aesar). The elements were weighted out in stoichiometric proportions using a high-precision Mettler balance; typical charges were on the order of 5 grams total, with individual element masses weighted out with an accuracy of 0.0005 g (0.5 mg). The stoichiometric proportions of the elements were placed into quartz ampoules of inside diameter 10 mm and wall thickness 0.5 mm. The ampoules were evacuated of air using a turbo molecular pump; typical final pressures were $<10^{-5}$ Torr. The ampoules were sealed under dynamic vacuum using an oxygen/methane torch and provided with a small quartz hook on the top. A wire was attached to this hook and the ampoules were suspended in a vertical Thermolyne tube furnace at room temperature. The furnace was heated at 0.3° C. $min^{-1}$ to 650° C. and held at that temperature for 12 hours. Subsequently, the furnace was cooled to room temperature at the rate of 0.4° C. $min^{-1}$.

The reacted material was placed into a stainless vial and ball milled for five minutes in a SPEX sample preparation machine. These ball-milled powders were then cold pressed into a pellet and re-ampouled under vacuum for annealing for two weeks at 450° C. It is envisioned the material can be annealed for less time or at a different temperature. The final product after annealing was ball milled for 30 minutes into fine powders and hot-pressed under argon atmosphere at 80 MPa pressure and 430° C. for 30 minutes.

It is envisioned hot poured samples can have a theoretical density of ≥95%. Synthesized two batches each of $Cu_{12-x}Zn_{2-x}Sb_4S_{13}$ and $Cu_{12-x}Fe_{2-x}Sb_4S_{13}$ samples. The high temperature thermoelectric property results presented herein were all gathered from the same pellet for each of the compositions. For some of the low temperature data, different pellets of the same nominal composition were used.

FIGS. 5a and 5b represent X-ray diffraction patterns for a) $Cu_{12-x}Zn_{2-x}Sb_4S_{13}$ and b) $Cu_{12-x}Fe_{2-x}Sb_4S_{13}$ samples. X-ray diffraction analysis of all of the synthesized specimens was performed by using a Rigaku Miniflex II benchtop X-ray diffractometer (Cu $K_\alpha$ radiation), and the results analyzed using a Jade software package. For each sample a small amount of hot-pressed material was powdered, spread on a microscope slide, and placed in the x-ray beam. FIGS. 5a) and 5b) show results of x-rays scans on representative $Cu_{12-x}Zn_{2-x}Sb_4S_{13}$ and $Cu_{12-x}Fe_{2-x}Sb_4S_{13}$ samples, respectively. All peaks index to the tetrahedrite phase. Also shown is an x-ray scan gathered from a natural mineral specimen; again the peaks index to the tetrahedrite phase. There is a small shift in the location of the peaks in the natural mineral relative to the synthetic specimens, most likely because the natural mineral contains a mixture of Sb and As on the semi metal site. In this regard, the material according to the present teachings can contain $Cu_{12-x}M_xSb_{4-y}As_yS_{13}$.

High temperature (373K-673K) Seebeck coefficient and electrical resistivity were measured in an Ulvac ZEM-3 system under argon. Typical specimen sizes for this measurement are 3×3×8 $mm^3$ with measurement performed along the long dimension. The thermal diffusivity (D) and heat capacity ($C_p$) from 373K to 673K were measured using the laser flash method (Netzsch, LFA 457) and differential scanning calorimetry (Netzsch, DSC200F3) respectively. The data were also confirmed independently in a second laboratory using an Anter Flashline 5000 thermal diffusivity apparatus and a calorimeter. Examples of data for thermal diffusivity and heat capacity are shown in FIGS. 6a) and 6b). FIGS. 6a and 6b represent a) thermal diffusivity and b) specific heat capacity for synthetic tetrahedrite specimens. Also shown in b) is the Dulong-Petit value for comparison.

FIG. 6c depicts low temperature electrical resistivity for a) $Cu_{12-x}Zn_{2-x}Sb_4S_{13}$ (circles: x=0; squares: x=0.5; triangles: x=1.0; diamonds: x=1.5) and b) $Cu_{12-x}Fe_{2-x}Sb_4S_{13}$ (circles: x=0; squares: x=0.2; triangles: x=0.5; diamonds: x=0.7. The samples used for heat capacity and diffusivity measurements were from adjacent sections of the same pellets as those used for high temperature resistivity and Seebeck coefficient The high temperature thermal conductivity was calculated using $\kappa=D*C_p*density$. Density measurements were performed using the Archimedes method with water as the suspending fluid. Low temperature resistivity was measured in a cryostat using four-probe technique on samples from a different batch than that used for high temperature measurements, but of the same nominal composition. The resulting data is shown in FIG. 6c.

FIG. 7 shows a plot of conductivity versus $T^{-1}$, as one might expect for carrier activation, for the Zn-containing samples. The results do not fill well to this model. Rather the data are better-described by a hopping type model. The Fe-containing samples can be described similarly. Low temperature Seebeck coefficients were measured on a series of Zn-containing samples in a flow cryostat using a steady state method. One end of a prism-shaped sample was attached to the cold head of the cryostat, while a small metal film heater/resistor embedded in copper was affixed to the other end. Two copper-constantan thermocouples were attached along the length of the sample to detect the temperature difference dT. The copper legs of the thermocouples were used to measure the Seebeck voltage. Both the high and low temperature Seebeck measurements by also measuring a bismuth telluride Seebeck standard sample (NIST SRM-xxxx), and found differences between measurements and the calibration values of no more than 5% over the range 80-573 K. Low temperature Seebeck measurements for the Zn-containing samples are shown in FIG. 6c. Values near room temperature differ slightly from those shown in FIG. 2c), because the samples measured at low temperature were from a different batch of the same nominal composition. Slight differences in absolute value from sample to sample are expected, because the properties depend on the actual content of Zn.

FIG. 7 represents low temperature electrical conductivity versus inverse temperature for $Cu_{12-x}Zn_{2-x}Sb_4S_{13}$ (circles: x=0; squares: x=0.5; triangles: x=1.0; diamonds: x=1.5). The data are not described well by a simple activation energy. The conductivity is better-described by a hopping model (inset, where conductivity is plotted versus $T^{-1/4}$). Low temperature Seebeck coefficient for $Cu_{12-x}Zn_{2-x}Sb_4S_{13}$. Circles: x=0; squares: x=0.5; triangles: x=1.0; diamonds: x=1.

Compounds of base composition $Cu_{12-x}M_xSb_4S_{13}$ with x=Fe, Zn, or Mn and 0<x<2 are synthesized as described below. Briefly, stoichiometric ratios of the desired elements are melted together in a quartz ampoule under vacuum. The resulting ingot is ground into a powder, pressed into a pellet, and annealed. The pellet can be re-ground into a powder and hot pressed into a pellet of density >98%. Compositions with x=0 have low resistivity ($10^{-3}$ ohm cm at 300 K), modest Seebeck coefficient (75 dV/K at 300 K) and moderately low thermal conductivity (1 W/m/K). Doping with Fe, Zn, or Mn increases both the resistivity and Seebeck coefficient, and substantially lowers the thermal conductivity. Over a wide range of Zn concentration (0<x<2.0 and preferably 0.5<x<1.5) or a wide range of Fe concentration (between 0<x<1.5 and preferably 0.2<x<1.0) the thermoelectric figure of merit remains in the range of 0.6-0.9 at 673 K, similar to or even exceeding that of the best state of the art thermoelectric materials in this temperature range.

The compositions which exhibit good thermoelectric properties span the range of the widespread natural mineral tetrahedrite compounds $Cu_{12-xMx}(Sb,As)_4S_{13}$ with M=Ag, Zn, Fe, Mn, or Hg. Optionally Tellurium can be substituted as a percentage of the S, or Cd can be substituted for Cu at certain fractions. This means that these natural minerals may be used directly or with small compositional modification as source materials for thermoelectric devices once processed into a pelletized or film structure.

As shown in FIG. 9, Thermoelectric devices using this material can be used for converting heat to electricity or electricity to cause a heat gradient. The device 98 has a first electrode 100 and a thermoelectric material disposed between the electrodes. It is envisioned that any of the materials disclosed herein can be used as a thermoelectric device. As such, they may be used, for example, to convert waste heat from an automobile engine or other vehicle to useful electrical power. Other potential industry targets include waste heat conversion in power generation (coal— and natural gas-burning power plants), steel production, and in residential/commercial boilers and water heaters. Further, thermoelectric materials are being developed for direct conversion of solar thermal energy to electricity, thereby acting to complement traditional solar cell technology. A thermoelectric device can have a pair of electrical and thermal conductors and a layer of tetrahedrite as a p-type or n-type material disposed between the pair of conductors. The layer of tetrahedrite has $Cu_{12-x}M_xSb_4S_{13}$, M is selected from the group of Zn, Fe, and combinations thereof. There would also be one of the opposite of n-type or p-type materials as is known. As shown in FIGS. 10 and 11, this other material could be a material other than a tetrahedrite. Alternatively with M being selected from the group consisting of Zn at a concentration 0<x<2.0 or Fe at a concentration between 0<x<1.5, or combinations thereof.

The $Cu_{12}Sb_4S_{13}$ samples can be synthesized by direct solid state reaction of the starting elements—Cu (99.99%, Alfa-Aesar), Sb (99.9999%, Alfa-Aesar), and S, Zn, Fe (99.999%, Alfa-Aesar). These raw materials were loaded in stoichiometric ratios into quartz ampoules that were evacuated to <$10^{-5}$ Torr. The loaded ampoules were then placed into a vertical furnace and heated at 0.3° C. min$^{-1}$ to 650° C. and held at that temperature for 12 hours. Subsequently, they were slowly cooled to room temperature at the rate of 0.4° C. min$^{-1}$. The resulting reacted material was placed into a stainless vial and ball milled for five minutes in a SPEX sample preparation machine. These ball-milled powders were then cold pressed into a pellet and re-ampouled under vacuum for annealing for two weeks at 450° C. The final product after annealing was ball milled for 30 minutes into fine powders and hot-pressed under argon atmosphere at 80 MPa pressure and 430° C. for 30 minutes. All the hot pressed samples were greater than 98% theoretical density, as measured using the Archimedes method.

If left un-annealed, it has been found that undesirable phases that affect the properties can be formed. In this regard, phases such as $Cu_3SbS_4$ that have high thermocoefficients can be formed. The annealing step is useful in reducing the amounts of secondary and tertiary phases. Grinding and hot pressing increases the density thus improving electrical conductivity an improving handling properties.

XRD analysis was performed by using a Rigaku Miniflex II bench-top X-ray diffractometer (Cu K$_\alpha$ radiation), and the results analyzed using a Jade software package. High temperature (373K-673K) Seebeck coefficient and electrical resistivity were measured in an Ulvac ZEM-3 system under argon. Low temperature Seebeck coefficient and resistivity were measured in a cryostat using four-probe techniques on samples from a different batch than that used for high temperature measurements, but of the same nominal composition. The thermal diffusivity (D) and heat capacity ($C_p$) from 373K to 673K were measured using the laser flash method (Netzsch, LFA 457) and differential scanning calorimetry (Netzsch, DSC200F3) respectively. The data were also confirmed independently in a second laboratory using an Anter Flashline 5000 thermal diffusivity apparatus and a calorimeter. The samples used for these measurements were from adjacent sections of the same pellets as those used for high temperature resistivity and Seebeck coefficient. The high temperature thermal conductivity was calculated using $\kappa=D*C_p*density$.

As shown in FIG. 9, the thermoelectric device can have a pair of conductors (thermal and electrical), and a layer of tetrahedrite disposed between the pair of conductors. The layer of tetrahedrite has $Cu_{12-x}M_xSb_{4-y}As_yS_{13}$ where M is selected from the group of Zn at a concentration 0<x<2.0, Fe at a concentration 0<x<1.5, and combinations thereof. The device can use a sintered tetrahedrite comprising $Cu_{12-x}M_xS_{4-y}As_yS_{13}$ wherein M is selected from the group of Zn at a concentration 0<x<2.0, Fe at a concentration 0<x<1.5, and combinations thereof.

To produce the thermoelectric device, material comprising $Cu_{12-x}M_xSb_4S_{13}$ wherein M is selected from the group of Zn at a concentration 0<x<2.0, Fe at a concentration 0<x<1.5, and combinations thereof is sintered to form a tetrahedrite microstructure. The sintered material is ground using a mill, and hot pressed, to a density of greater than 95% to form a pellet. The pellet is placed between a pair of electrical conductors.

Tetrahedrite-structure compounds, of general composition $Cu_{12-x}Zn_xSb4S_{13}$, are an earth-abundant alternative to PbTe for thermoelectric power generation applications in the intermediate high temperature range (300-400° C.). Tetrahedrites can be synthesized in the laboratory using a multi-step process involving long annealing times. However, this compound also exists in natural mineral form and, in fact, is one of the most abundant copper-bearing minerals in the world. By simply mixing natural mineral tetrahedrite with pure elements through high-energy ball milling without any further heat treatment, material with figure of merit near unity at 723K can be obtained.

Another direct approach to increase zT is to design and synthesize thermoelectric materials with intrinsically low lattice thermal conductivity caused by large lattice anharmonicity. One example is the newly reported copper-antimony/arsenic-sulfur ternary family of compounds known as tetrahedrite/tennantite, which occurs also as a natural mineral and is in fact the most widespread sulfosalt on Earth. This class of compounds, of general composition $Cu_{12-x}(Zn, Fe)_x(Sb,As)_4S_{13}$ with 0<x<2, has a strongly anharmonic phonon spectrum, which is thought to arise from the existence of a lone pair of electrons surrounding the Sb/As atoms. Compounds with Sb on the pnictide site are geologically referred to as tetrahedrite, while those with As on this site are known as tennantite, and a complete solid solution exists between these two members. Described herein is a synthetic specimens exhibit a maximum zT near unity at 723 K for x=1.5 for Zn and x=1.0 for Fe, but maintain zT>0.8 over a wider range of x. The natural mineral, on the other hand, typically has x~2, corresponding to a copper composition near 10.0, and is almost insulating.

As disclosed below, thermoelectric devices using natural minerals themselves may serve directly as source thermoelectric materials if their compositions can be adjusted to fall into the optimum range for thermoelectricity, namely a Zn (Fe) concentration of 1.0-1.5, corresponding to a Cu concentration of 10.5-11.0. Alternatively, minerals can be chemically modified so as to place the material into the optimum range for thermoelectricity, namely a Zn (Fe) concentration of 1.0-1.5, corresponding to a Cu concentration of 10.5-11.0. As such, a method of mixing natural mineral tetrahedrites with synthetic $Cu_{12}Sb_4S_{13}$ was developed, in order to "dilute" the Zn concentration of the natural mineral; this process successfully produces material containing up to 50% natural mineral with zT once again near unity. This allows producers to use of large amounts of natural mineral tetrahedrite directly to produce a high-performing thermoelectric. However, because the processing of synthetic $Cu_{12}Sb_4S_{13}$, used to optimize the composition of the natural mineral, employs a traditional solid state reaction followed by at least a one week anneal, which still requires significant energy and time.

As described below, a rapid method of synthesizing tetrahedrite thermoelectric material by high energy ball milling of natural mineral powder or ore mixed with small amounts of elemental Cu, Sb, and S powder, followed by consolidation using hot pressing is presented. A preferable feature of this process is that it requires no additional heat treatment. The presence of the natural mineral tetrahedrite acts as a "seed matrix" that accepts the additional elements into its structure, thus modifying the composition to yield high zT of approximately 0.9 at 723K. This value compares very favorably with other p type thermoelectric materials in this temperature region.

X-ray diffraction (XRD) patterns of samples made by mixing 50% by weight natural mineral (nominal composition $Cu_{97}Zni_{-1.9}Fe_{0.4}As_4S_{13}$) with Cu, Sb, and S powders (the latter in a molar ratio of 12:4:13), as a function of ball milling time, are displayed. Also shown for comparison are the patterns for pure synthetic $Cu_{12}Sb_4S_{13}$ and the pure natural mineral. The latter two samples exhibit a single phase pattern corresponding to the tetrahedrite (or tennantite) crystal structure; the peaks are shifted in these two samples primarily due to the different atom on the pnictide site. Peaks corresponding to the tetrahedrite structure for the ball milled samples lie between the patterns of pure synthetic $Cui_2Sb_4S_{13}$ and pure natural mineral, indicating good mechanical alloying effect. For the sample milled for one hour, a noticeable pattern of $Cu_3SbS_4$ (famantite) phase was observed.

FIG. 8 represents a system for forming the materials according to the present teachings. This phases form readily when Cu, Sb, and S are ball milled together alone without the natural mineral present. When the ball milling time is increased to 3 hours, this impurity phase of $Cu_3SbS_4$ becomes minute; after six hours of milling, the sample is almost exclusively tetrahedrite structure with only a trace amount of Cu, which is observed in all of the ball milled samples.

FIGS. 10 and 11 represent an XRD of the materials showing that that milling the elemental powders for three to six hours is sufficient to form single-phase tetrahedrite solid solution in the presence of the natural mineral. To verify the role of the natural mineral as a "seed matrix" for the formation of single-phase tetrahedrite structure, pure elements by in the ratio of 12:4:13 were ball milled without the presence of the natural mineral. After 6 hours of ball milling, the final product has at least 50% $Cu_3SbS_4$. It is believed that a percentage of natural mineral serves as a parent matrix, efficiently absorbing or facilitating the orderly combining of the Cu, Sb, and S elements into/onto the crystal structure, altering its composition but maintaining its single phase tetrahedrite character.

It is envisioned that the amount of natural crystal or ore which is used to seed the material in the ball mill can vary from >0 to about 75%, and particularly between 10% and 60%, and most particularly between more than 40% and less than about 50%. This seed crystal, however, could be formed of stoichiometrically pure materials which have been sintered as described above. The pure materials in a proper stoichiometric ratio can be slowly added to the high energy ball mill to assist in the facilitation of the incorporation of the material to grow the desired crystal structure in the form of a powder.

Figure 16:
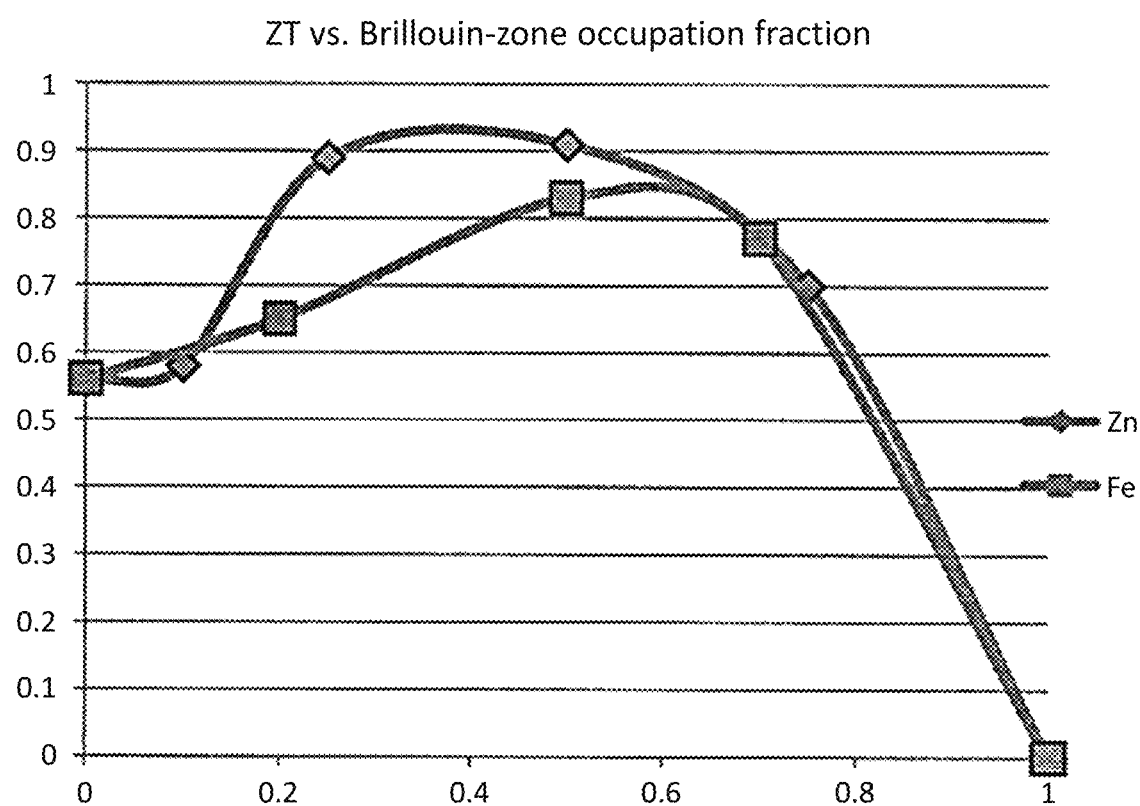

FIGS. 12-15 show varying material properties related to the material. As shown, variation of X from 0 to 1.5 result in varying material properties such as Seebeck coefficient, resistivity, Power factor, Laterla thermal conductivity ZT. FIG. 16 shows ZT vs Brillouin zone occupation fraction. Shown is the similarities and differences in occupation fraction between Zn and FE. shows the temperature dependence of the thermoelectric properties of the mixture of natural mineral and pure elements after ball milling and consolidation. Samples with 25 wt % and 50 wt % pure elements added to the natural mineral for different ball milling time were investigated.

A simplified notation to describe different samples is shown. For example, 50%-3 hour means the sample has 50 wt % pure elements addition and a three hour ball milling time. As mentioned above, the Zn(Fe) substitution value of the natural mineral is close to two. Notably, by adding Cu into the natural mineral (along with stoichiometric amounts of Sb and S), the Fermi level was moved back down close to the top of the valence band in order to optimize the transport properties. As can be seen from FIG. 25a, the resistivity of samples with 50 wt % pure element addition is a 5-6 times smaller than that of 25 wt % element addition samples.

Increasing the ball milling time from one to three hours reduces the resistivity for a given composition since the additional milling suppresses the amount of the impurity $Cu_3SbS_4$ phase. When the ball milling time was extended to six hours, the resistivities increase for both 25 wt % and 50 wt % additions, which is typical for ball milling synthesis with extended ball milling time. The contamination from the milling media and wear on the jar, an increased density of nanosized defects on the surface of grains and strain in the crystal lattice induced by ball milling may all contribute to the degradation of electrical properties.

The amount of pure element addition also has significant effect on the Seebeck coefficient. For the 25 wt % element addition samples, the Seebeck coefficients are all between 250 and 300 while for 50 wt % element addition samples, the Seebeck coefficients are reduced to 150-200 due to an increase in carrier concentration. The power factor results shown in FIG. 11c indicate that the 25% pure element addition samples have a maximum value of power factor of 3|iW cm" K" with three hour ball milling. For the 50% pure element addition samples with six hours of ball milling, the degradation of electrical conductivity is offset by enhancement of the Seebeck coefficient, and the power factor remains at a high value of 5.8|iW cm" K". Therefore, the ball milling time can be extended without degrading power factor if more pure elements are added for ball milling.

The temperature dependence of total thermal conductivity of all samples. The 25 wt % element addition samples have a weakly temperature dependent thermal conductivity with values in the range of 0.3-0.4 W m"¹ K"¹, indicating the intrinsic low lattice thermal conductivity from tetrahedrite structure dominates. In contrast, the total thermal conductivity of the 50 wt % addition samples increases significantly with increasing temperature since these samples have much lower resistivity and thus a larger electronic thermal conductivity contribution that increases quickly with increasing temperature. At the highest test temperature of 723K, the total thermal conductivity begins to decline.

This is consistent with the increase in resistivity in this temperature range. Although sample 50%-1 h has higher resistivity than that of 50%-3 h and 50%-6 h, it still has higher total thermal conductivity over the entire temperature range. This can be explained by its larger grain size and presence of small amounts of $Cu_3SbS_4$, which has much higher thermal conductivity than tetrahedrites. The 50%-6 h sample has lower total thermal conductivity than that of 50%-3 h, resulting from both the reduced electronic part and smaller grain size. Combining the results for the power factor and total thermal conductivity yields the figure of merit zT, shown in FIG. 11e. The zT value of sample 50%-6 h reaches 0.9 at 723K, which is comparable to other p type thermoelectric materials at this temperature. For the 25 wt % element addition samples, zT reaches 0.7 after 3 hours of ball milling. These results indicate that the optimal ball milling time is variable with different amount of pure element addition.

The high performance thermoelectric materials with zT of 0.9 were synthesized by using natural mineral tetrahedrite and a high-energy ball milling method. Nearly single-phase tetrahedrites with compositions optimized for thermoelectric performance were obtained after ball milling the natural mineral tetrahedrite and pure elements without additional heat treatment. The high zT value results from the intrinsic low thermal conductivity of the tetrahedrite crystal structure and the small grain size of the pressed pellets.

The fraction {j} of hole states filled in the valence band upon substitution:/=xNj2, where $N_e$ is the number of excess electrons contributed by each M ion.[6] For example, for x=0.5 Fe substitution ($N_e$=2), the fraction is 0.5, while for x=0.5 Zn substitution ($N_e$=1), the fraction is 0.25. A zT value higher than 0.7 can be maintained if the hole filling fraction is in the range 0.2-0.8. This wide range of hole filling fraction also allows for a wide range of impurity concentrations in these materials. Described herein is a simple way to directly make use of a natural mineral to synthesize high performance thermoelectric materials with zT values of unity at 723 K, comparable to other p-type thermoelectric materials in this temperature region. While these minerals potentially contain toxic arsenic, the content of this element in actual minerals is very low (at maximum 13 atomic percent in pure tennantite, but more typically less than 5 atomic percent in most mineral rendering them far less toxic than PbTe-based compounds which contain as much as 50 atomic percent Pb.

As source materials for synthesis of the samples, two natural mineral ore specimens, here designated Natural Mineral 1 (NMI) and Natural Mineral 2 (NM2), were purchased from a mineral specimen company. In order to obtain compositional information on these two specimens, an energy-dispersive X-ray analysis (EDS) was performed using a Scanning Electron Microscope (SEM; JEOL Model 7500F). Based on the results of this analysis, the compositions of NMI and NM2 were determined to be approximately $Cu_{10.5}Fe_{1.5}As_{36}Sb_{0.4}S_{13}$ and $Cu_{9.7}Zn_{1.9}Fe_{0.4}As_4S_{13}$, respectively.

Like all minerals designated geologically as tetrahedrite, these two specimens are solid solutions of pure tetrahedrite ($Cu_{12}Sb_4S_{13}$, which does not occur naturally) and tennantite ($Cu_{12}As_4S_{13}$), with substitution of Zn or Fe on the copper site. Unfortunately, the hole filling fractions of the two specimens are much higher than the fraction expected to give rise to high zT, which indicates materials cannot directly use these two specimens as Thermoelectric materials without any adjustment of their composition. Therefore, a simple method of "diluting" these rocks into the right hole filling fraction region was developed by mixing different amounts of pure synthetic $Cu_{12}Sb_4S_{13}$ (hereafter designated sample SYN) with the natural mineral to form a solid solution within the desired composition range.

The SYN sample was then pulverized with a mortar and pestle and the powder were mixed with natural mineral powders in a stainless balling milling vial with stainless steel balls in mass ratios of 1:3, 1:1 and 3:1. The vial was sealed in an argon-filled glove box and the powder mixture was milled for 30 min using a SPEX Sample Prep 8000 Series Mixer/Mill. The fine powder after the ball milling was loaded into a high-density graphite die with diameter of 10 mm for hot pressing under argon atmosphere.

The hot pressing procedure was carried out at 723 K and 80 MPa for 30 minutes and all the final pellets were found to be greater than 98% of theoretical density. The final products were cut by a diamond saw into two sample geometries: bars of dimension $3 \times 3 \times 8$ mm$^3$ for electronic transport property measurement (electrical resistivity and Seebeck coefficient) and disks of dimension 10 mm diameter by 2 mm thickness disks for thermal conductivity tests, respectively. Hot pressed samples of pure SYN, pure NMI, and pure NM2 were also prepared for comparison.

The phase purity of the hot-pressed pellets was checked by performing X-ray diffraction analysis (using a Rigaku Miniflex II bench-top X-ray diffractometer) on powders obtained from small pieces of the pellets. The diffraction patterns were analyzed using a Jade software package. The micromorphology and homogeneity of samples were characterized using SEM. Seebeck coefficient and electrical resistivity was measured in an Ulvac ZEM-3 system under helium atmosphere from room temperature to 723 K. In order to check the thermal stability, data were collected on both heating and cooling cycles; the difference of power factor between heating and cooling at the same temperature point was within 10%. In addition, no evidence of evaporation or degradation of any of the samples after heating to 723 K was observed. The thermal diffusivity ($\pounds$>) was measured using the laser flash method (Netzsch, LFA 457) with all samples coated with carbon. For all samples, thermal diffusivity measurements were performed twice on two different disks with the same composition but different thickness in order to avoid the influence of laser stabilization time.

The difference between the two measurements did not exceed 7%. Differential scanning calorimetry (Netzsch, DSC200F3) was used to measure the heat capacity ($C_p$). All the heat capacity data are close to or higher than the Dulong-Petit value of pure $Cu_{12}Sb_4S_{13}$. The room temperature densities (p) of the samples were measured using the Archimedes method with ethanol as the suspending fluid. The samples used for thermal properties measurements were cut from the same pellets as those used for transport properties. The thermal conductivity was calculated using $\kappa = DC_p p$. The uncertainties in the resistivity and Seebeck coefficient measurements are estimated to be approximately 3% each, while that in the thermal conductivity is estimated to be approximately 8%. When combined in quadrature, these errors give rise to an uncertainty in zT of approximately 10%. These values are reflected by the error bars in the plots.

Figure 17:
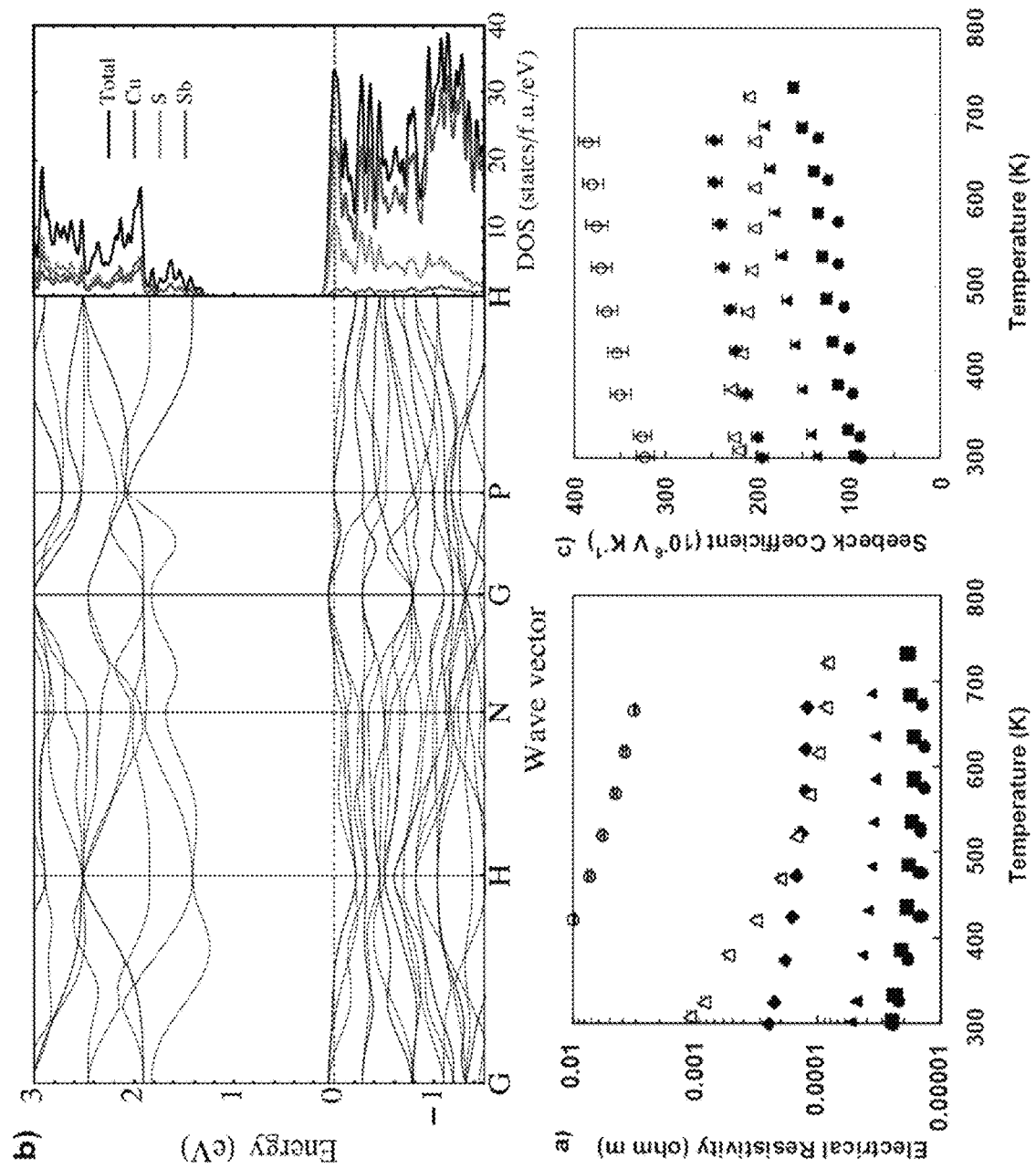

FIG. 17 depict Electronic properties of tetrahedrite. a), electrical resistivity of powder-processed synthetic tetrahedrite pellets (closed symbols) of composition $Cu_{12-x}Zn_xSb_4S_{13}$ above room temperature (circles: x=0; squares: x=0.5; triangles: x=1.0; diamonds: x=1.5). The magnitude of the resistivity is in the range typical of good thermoelectric materials. For higher Zn substitution, holes in the valence band are filled and the material becomes insulating for x=2. Open circles represent a pellet synthesized from natural tetrahedrite of nominal composition $Cu^{\wedge}Fe_{.5}As_{36}Sb_{0.4}S_{13}$, while the open triangles are for a pellet synthesized using a combination of this natural material and synthetic $Cu_{12}Sb_4S_{13}$. b). Electronic band structure and density-of states (DOS) of $Cu_{12}Sb_4S_{13}$. Fermi level is marked by a dashed line. Decomposition of the total DOS into contributions from Cu, Sb, and S shows the predominantly Cu 3d and S 3p character of valence bands, c). Seebeck coefficient of tetrahedrite of composition $Cu_{12-x}Zn_xSb_4S_{13}$; sample designation as in a). Seebeck coefficient rises strongly with temperature and Zn content, reaching values in excess of 200 (.iV K$^{-1}$. Like the resistivity, the Seebeck coefficient of the pellet synthesized using natural mineral tetrahedrite can be controlled by dilution with synthetic source material.

The powder XRD patterns of NM2, SYN, and a (1:1) mixture of the two are shown in FIG. 18. All the major diffraction peaks match to the pattern of tennantite ($Cu_{12}AsS_{13}$)-tetrahedrite ($Cu_{12}Sb_4S_{13}$), with only a peak shift observable. As seen, the pattern of mixture has no sign of any second phase and its peaks are located between the two pure phases. Similar results are obtained for different mixture compositions and also using mineral NMI. The simple dilution method can give rise to perfect solid solutions between the pure synthetic sample and the natural mineral without changing the crystal structure, which is crucial to maintaining the intrinsic low thermal conductivity.

As shown, in FIG. 19-21, Scanning Electron Microscopy (SEM) images of fracture surfaces of a disk hot pressed using powder consisting of 50% elements and 50% natural mineral as a function of ball milling. As the ball milling time is increased from one to three hours, the average grain size is reduced from 330 nm to 180 nm; milling for six hours, however, reduces the grain size to only 150 nm. Detailed EDS mapping results (see supplementary online material) show that all of the major elements are homogenously distributed in the sample without any sign of segregation. While forming the tetrahedrite phase by synthesis directly from the elements requires a very extended anneal (one week or longer), the elements can be incorporated readily into the natural mineral tetrahedrite matrix simply by mechanical alloying.

in FIG. 19, Scanning electron microscope (SEM) images for a hot-pressed (0.50 NM2:0.50 SYN) sample. Top left: SEM image of a fractured surface, indicating grain size in the range of 100-500 nm. The remaining images display maps of the atomic distribution, as determined by Electron Dispersive X-ray (EDX) analysis, of S, Cu, As, Sb, and Zn, respectively and indicated a uniform distribution of these elements in the sample. FIG. 20 represents SEM images of the (1.0 NM2:1.0 SYN) mixture after hot pressing. The SEM image on the fracture surface reveals grain size of in the range of 100-500 nm. The small grain size was induced during the balling milling process, and is largely maintained throughout the hot pressing procedure, which is carried out at relatively low temperature. Although the tetrahedrites have very low intrinsic thermal conductivity, additional phonon scattering from grain boundaries may also contribute to the low thermal conductivity. EDS analysis performed on the same area of the SEM image shows that all the major elements in the mixture are homogeneously distributed throughout the sample, which also provides further evidence for the formation of a perfect solid solution between the natural mineral and pure SYN.

The samples had total mass around 2 g of elemental Cu (powder, 10 micron, 99.9%), Sb (shot, 99.999%), S (pieces, 99.999%) from Alfa Aesar were weighed by stoichiometry of $Cu_2Sb_4Si_3$ and loaded into a tungsten carbide vial with tungsten carbide balls. Subsequently, the raw natural mineral [ref] with composition of $Cu_9jZni_{.9}Feo.4As_4Si_3$ as determined by Energy Dispersive Spectroscopy (EDS) was weighed with the mass ratio of 3:1 and 1:1 (compared to the mass of mixture of the elements described above), ground into a powder using mortar and pestle, and then loaded into the same vial. The vial was sealed under argon and then placed into a SPEX 8000M (SPEX SamplePrep) ball mill for high energy ball milling.

Milling times of one, three, and six hours were performed to investigate the effect of milling time on the phase formation and grain size. The product powders were hot pressed in high density graphite dies with 10 mm diameter at 723K and 80 MPa pressure for 30 minutes, in an argon-filled glove box, followed by free cooling to ambient temperature in 3 hours. The final products were then cut using a diamond saw into two samples of different geometry: a) a bar of dimension 3 cm×3 cm×8 cm, for electronic transport measurements, and b) a disk of diameter 10 mm diameter disk and thickness of 1.5 mm, for thermal diffusivity measurement.

FIG. 21 depicts Scanning electron microscope (SEM) images for a sample with 50% wt pure element addition: (a) the specimen with 1 hour ball milling; (b) the specimen with 3 hour ball milling; (c) the specimen with 6 hour ball milling. The average grain size for the three cases is 330, 180, and 150 nm, respectively. Shown are Scanning Electron Microscopy (SEM) images of fracture surfaces of a disk hot pressed using powder consisting of 50% elements and 50% natural mineral as a function of ball milling time are shown in FIG. 2. As the ball milling time is increased from one to three hours, the average grain size is reduced from 330 nm to 180 nm; milling for six hours, however, reduces the grain size to only 150 nm. Detailed EDS mapping results (see supplementary online material) show that all of the major elements are homogenously distributed in the sample without any sign of segregation. It is quite remarkable that, while forming the tetrahedrite phase by synthesis directly from the elements requires a very extended anneal (one week or longer), the elements can be incorporated readily into the natural mineral tetrahedrite matrix simply by mechanical alloying.

FIG. 22 represents Thermal conductivity of tetrahedrite specimens, a) total and b) lattice thermal conductivities of $Cu_{12-x}Zn_xSb_4S_{13}$. The magnitude of the conductivity is comparable to or even smaller than typical thermoelectric materials like lead telluride or skutterudite. Zn-containing samples approach minimal thermal conductivity values over most of the temperature range, as does pure $Cu_{12}Sb_4S_{13}$ at the highest measurement temperatures.

FIG. 23 Electrical and thermal transport properties of tetrahedrite-based samples, made by hot-pressing mixtures of natural mineral tetrahedrite (NM1 or NM2) and synthetic tetrahedrite (designated SYN). Sample designation: circles: (0.75 NM:0.25 SYN); squares: (0.50 NM:0.50 SYN); triangles: (0.25 NM:0.75 SYN); crosses represent the pure synthetic sample (SYN). Closed symbols are for natural mineral NM1, open symbols for natural mineral NM2. The electrical resistivity (a) indicates a semiconducting behavior for all samples, with a magnitude that decreases with increasing content of synthetic material. The Seebeck coefficient (b) also decreases with increasing content of SYN, but remains above 150 $(A/K^{-1}$ for all samples. The samples made by mixing natural and synthetic powders all have thermal conductivity (c) below 0.7 W m $K~^{-1}$. Thermoelectric figure of merit (d) rises close to unity for the sample (0.50 NM2: 0.50 SYN), synthesized from a mixture of natural mineral powder and synthetic tetrahedrite.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of forming a thermoelectric device, the method comprising:
   high energy milling a natural tetrahedrite ore with a powder selected from the group consisting of elemental Cu, elemental Sb, elemental S, and combinations thereof to form a tetrahedrite composition having a stoichiometric ratio of $Cu_{12-x}M_xSb_{4-y}As_yS_{13}$, wherein M is a transition metal, $0<x<2.0$, and $0=<y=<4.0$; and
   placing a layer of the tetrahedrite composition between a pair of thermal conductors.

2. The method of forming a thermoelectric device according to claim 1, wherein the layer of tetrahedrite comprises $Cu_{12-x}M_xSb_4S_{13}$; with M being selected from the group consisting of Zn at a concentration $0<x<2.0$ or Fe at a concentration between $0<x<1.5$, or combinations thereof.

3. The method of forming a thermoelectric device according to claim 1, wherein the tetrahedrite comprises $Cu_{12-x}M_xSb_{4-y}As_yS_{13}$ where M is selected from the group consisting of Ag, Zn, Fe, Mn, Hg or combinations thereof.

4. The method of forming a thermoelectric device according to claim 1, comprising tellurium (Te) as a portion of the S.

5. A method of forming a thermoelectric device, the method comprising:
   making a tetrahedrite powder by high energy milling a natural tetrahedrite ore with a powder material selected from the group consisting of pure elemental Cu, pure elemental Sb, pure elemental S, and combinations thereof to form a powdered material having stoichiometric ratio $Cu_{12-x}M_xSb_{4-y}As_yS_{13}$, wherein M is a transition metal, $0<x<2.0$, and $0=<y=<4.0$;
   solidifying the powdered material to form solidified tetrahedrite; and
   placing a layer of the solidified tetrahedrite between a pair of thermal conductors.

6. The method of forming a thermoelectric device according to claim 5, wherein the layer of solidified tetrahedrite comprises $Cu_{12-x}M_xSb_4S_{13}$; with $0<x<2$.

7. The method of forming a thermoelectric device according to claim 5, wherein M includes a transition metal selected from the group consisting of Ag, Zn, Fe, Mn, Hg and combinations thereof.

8. The method of claim 1 further comprising:
   solidifying the tetrahedrite composition under heat, pressure, or a combination of heat and pressure.

9. The method according to claim 8, wherein M includes one or more transition metals selected from the group consisting of Ag, Zn, Fe, Hg and Mn.

* * * * *